United States Patent
Lin et al.

(10) Patent No.: US 11,749,575 B2
(45) Date of Patent: Sep. 5, 2023

(54) SEMICONDUCTOR PACKAGE STRUCTURE HAVING RING PORTION WITH RECESS FOR ADHESIVE AND METHOD FOR FORMING THE SAME

(71) Applicant: Taiwan Semiconductor Manufacturing Company, Ltd., Hsinchu (TW)

(72) Inventors: Hui-Ting Lin, Tainan (TW); Chin-Fu Kao, Taipei (TW); Chen-Shien Chen, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/462,850

(22) Filed: Aug. 31, 2021

(65) Prior Publication Data
US 2023/0062958 A1   Mar. 2, 2023

(51) Int. Cl.
*H01L 23/31* (2006.01)
(52) U.S. Cl.
CPC .................. *H01L 23/31* (2013.01)
(58) Field of Classification Search
CPC ........................................... H01L 23/31
USPC ........................................... 257/704
See application file for complete search history.

(56) References Cited

U.S. PATENT DOCUMENTS

| 2013/0154085 A1* | 6/2013 | Choi | H01L 23/36 438/122 |
| 2020/0176357 A1* | 6/2020 | Yu | H01L 23/10 |

FOREIGN PATENT DOCUMENTS

JP          2007128987 A  * 5/2007  ............. H01L 23/04

* cited by examiner

*Primary Examiner* — Ajay Arora
(74) *Attorney, Agent, or Firm* — Birch, Stewart, Kolasch & Birch, LLP

(57) ABSTRACT

A package structure is provided. The package structure includes a substrate, a cover element, a semiconductor device, a protruding element, and an adhesive element. The cover element is disposed on the substrate and having a ring portion, a space is surrounded by the ring portion, and a recess is formed on a surface of the ring portion that faces the substrate. The semiconductor device is disposed on the substrate and disposed in the space surrounded by the ring portion, wherein the semiconductor device is spaced apart from the recess by the ring portion. The protruding element extends from the substrate and disposed in the recess. The adhesive element is disposed in the recess, wherein in a top view, the semiconductor device is surrounded by the protruding element.

20 Claims, 26 Drawing Sheets

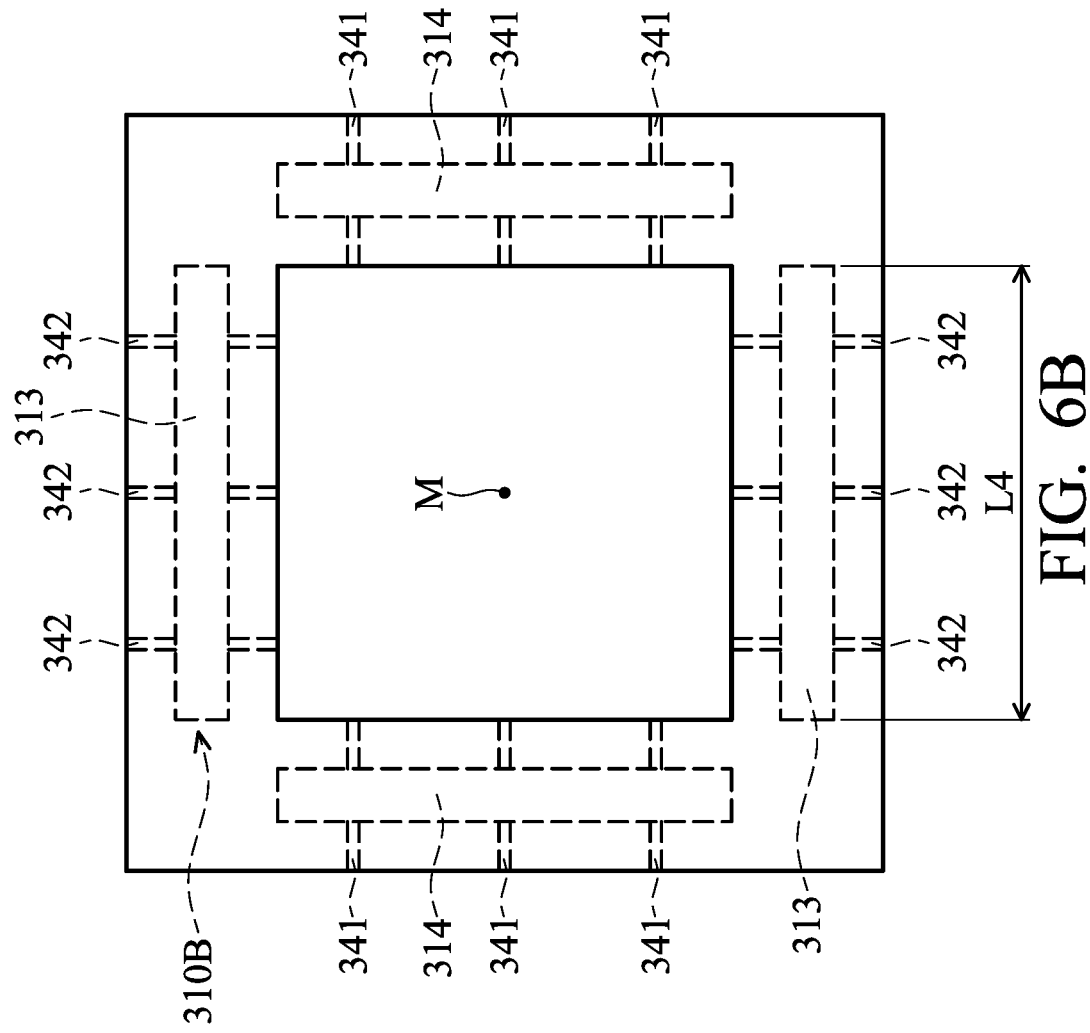

SEMICONDUCTOR PACKAGE STRUCTURE HAVING RING PORTION WITH RECESS FOR ADHESIVE AND METHOD FOR FORMING THE SAME

BACKGROUND

Semiconductor devices are used in a variety of electronic applications, such as personal computers, cell phones, digital cameras, and other electronic equipment. Semiconductor devices are fabricated by sequentially depositing insulating or dielectric layers, conductive layers, and semiconductor layers over a semiconductor substrate, and patterning the various material layers using lithography and etching processes to form circuit components and elements thereon. Many integrated circuits (ICs) are typically manufactured on a single semiconductor wafer, and individual dies on the wafer are singulated by sawing between the integrated circuits along a scribe line. The individual dies are typically packaged separately, in multi-chip modules, for example, or in other types of packaging.

A package (structure) not only provides protection for semiconductor devices from environmental contaminants, but also provides a connection interface for the semiconductor devices packaged therein. Smaller package structures, which take up less area or are lower in height, have been developed to package the semiconductor devices.

Although existing packaging structures and methods for fabricating package structure have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6A to FIG. 6C are top views showing different cover elements in some embodiments of the present disclosure.

DETAILED DESCRIPTION

Figure 1A:
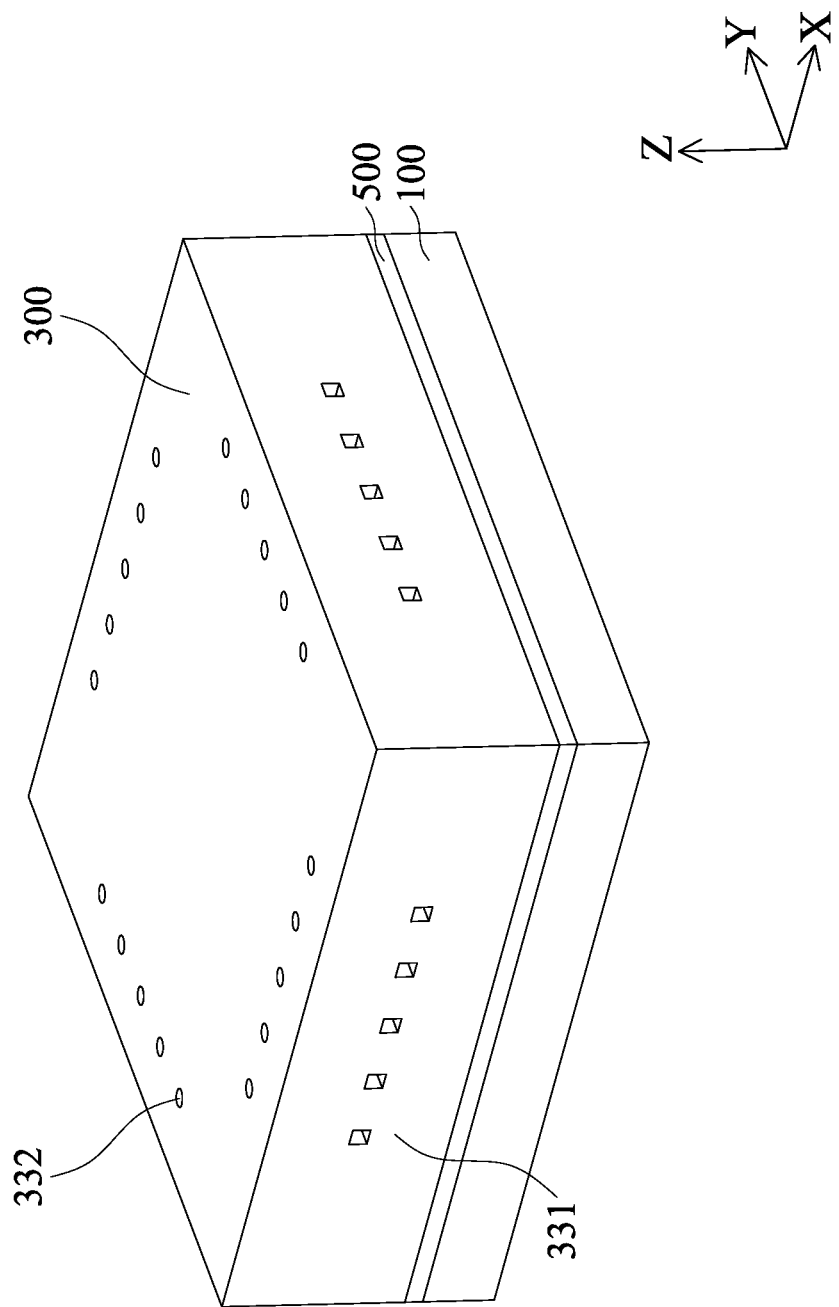
FIG. 1A is a schematic view of a package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%. The terms "each" in the description are to be interpreted so as not to exclude variations among units and not to exclude an omission of a part of the units.

A package structure and the method for forming the same are provided in accordance with various embodiments. Some variations of some embodiments are discussed. Throughout the various views and illustrative embodiments, like reference numbers are used to designate like elements. In accordance with some embodiments of the present disclosure, a package structure includes a cover element (stress-relief structure) for controlling warpage of a package substrate, such as a ring structure or a lid structure. In some embodiments, the cover element is disposed on a substrate with a protruding element. The protruding element provides a higher contact area for the adhesive element disposed between the cover element and the substrate, and the flow of the adhesive element may be constrained by the protruding element as well, thereby reducing stress concentration or cracking in certain areas of the package, which will be described in detail below. Accordingly, the reliability of the entire package structure is improved.

Embodiments will be described with respect to a specific context, namely a packaging technique with an interposer substrate or other active chip in a two and a half dimensional integrated circuit (2.5DIC) structure or a three dimensional IC (3DIC) structure. Embodiments discussed herein are to provide examples to enable making or using the subject matter of this disclosure, and a person having ordinary skill in the art will readily understand modifications that can be made while remaining within contemplated scopes of different embodiments. Although method embodiments may be discussed below as being performed in a particular order, other method embodiments contemplate steps that are performed in any logical order.

Embodiments of the disclosure may relate to 3D packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
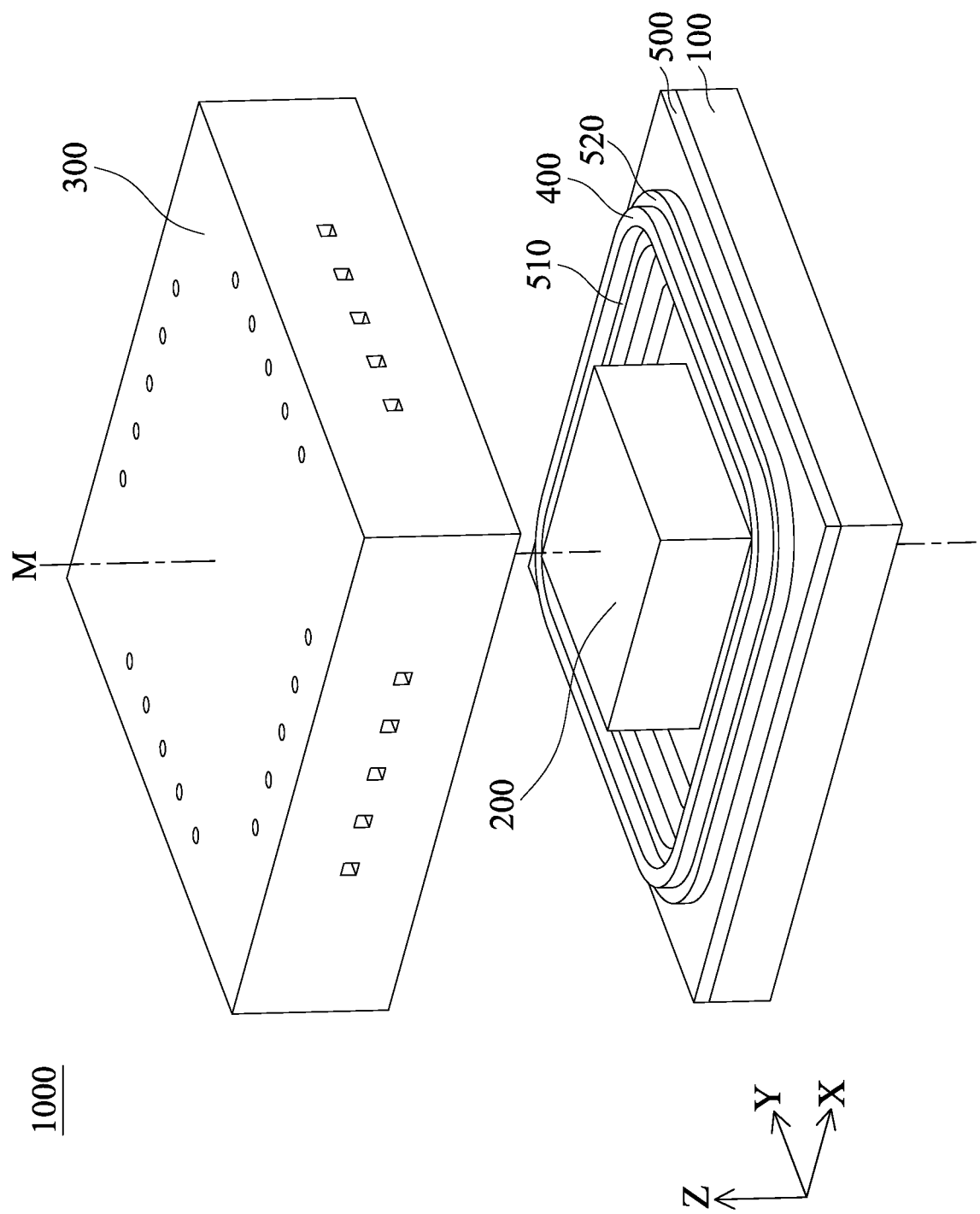
FIG. 1B is an exploded view of the package structure in accordance with some embodiments of the present disclosure.
Figure 1C:
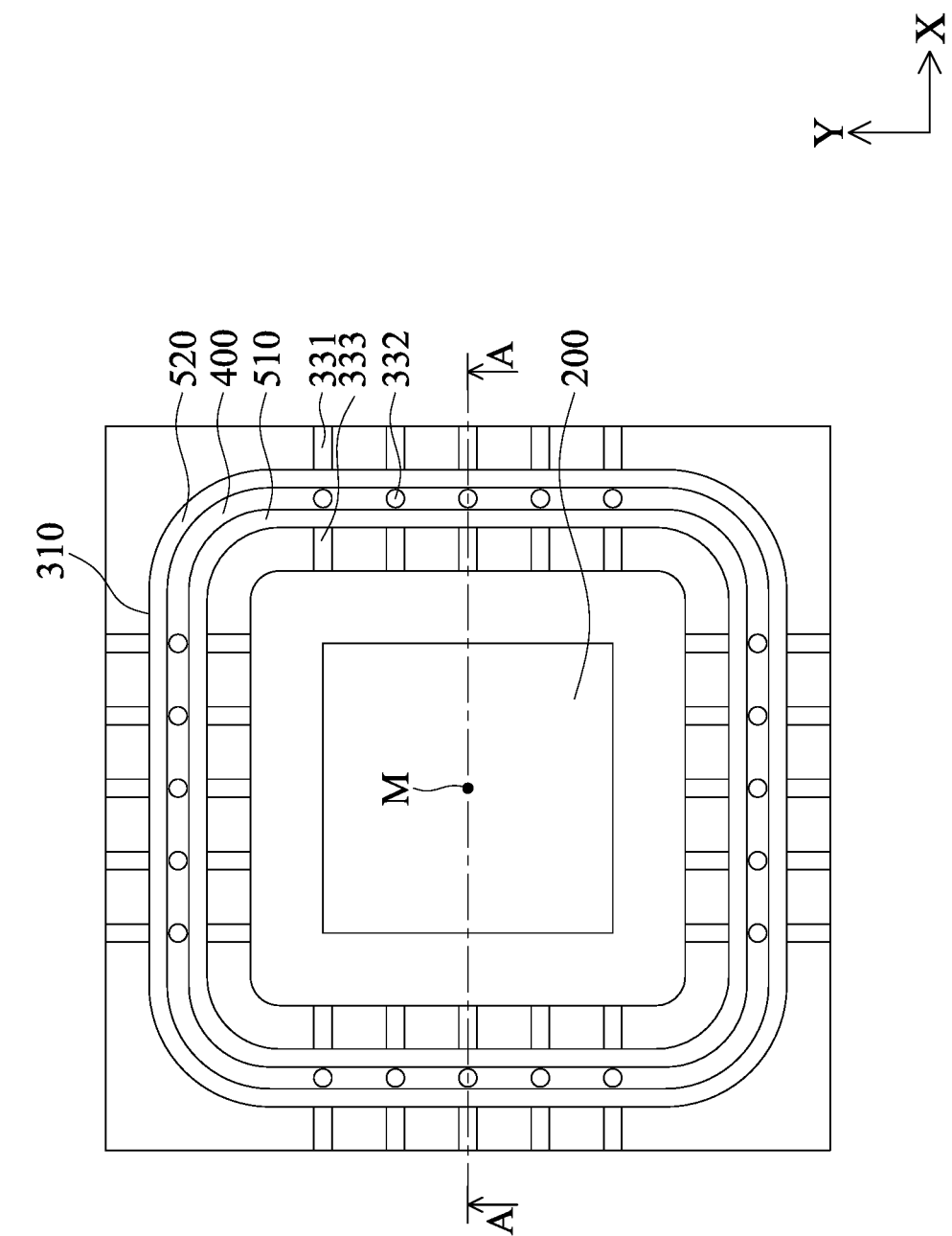
FIG. 1C is a top view of the package structure in accordance with some embodiments of the present disclosure.
Figure 1D:
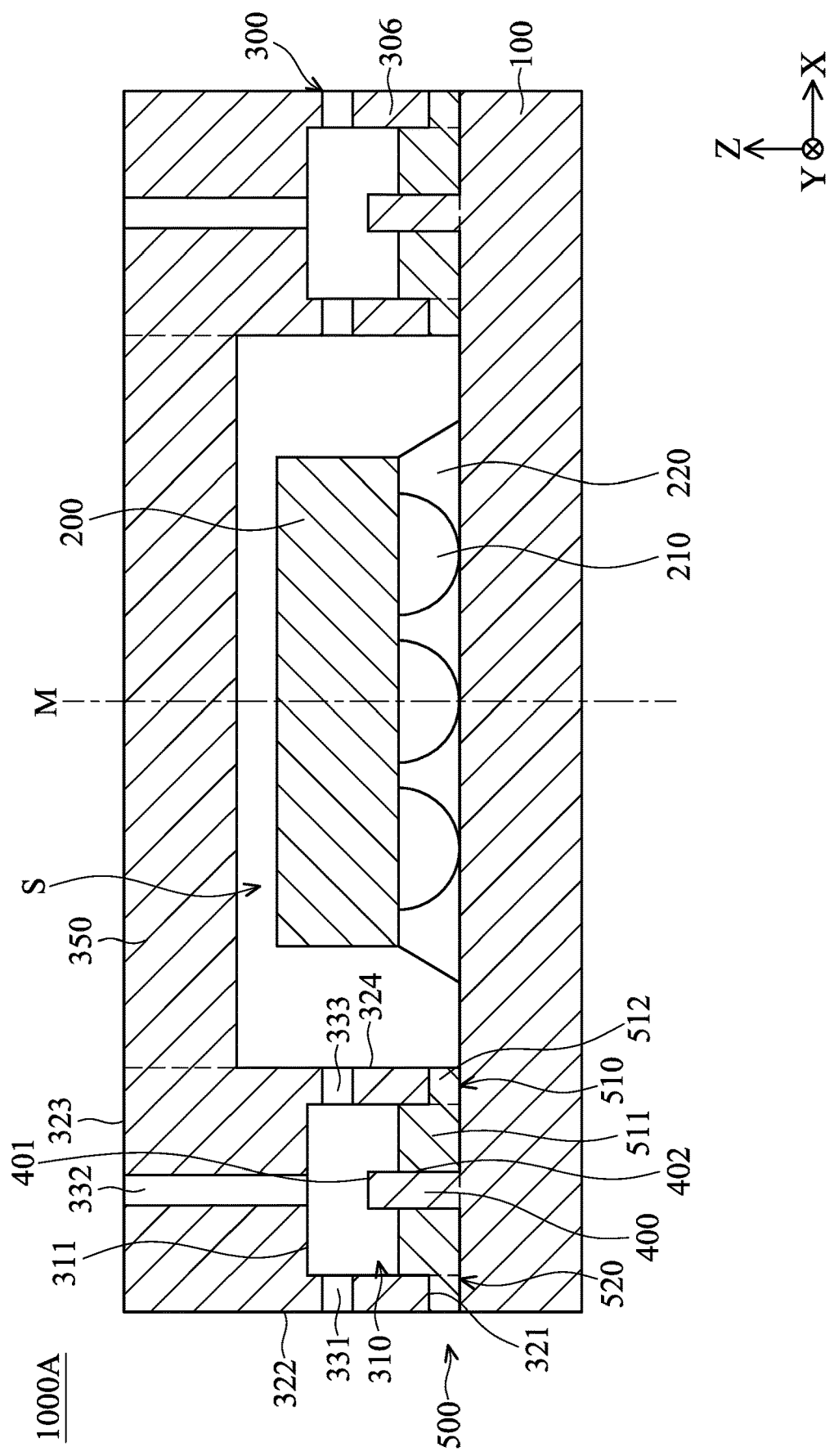
FIG. 1D is a cross-sectional view of a package structure in some embodiments of the present disclosure.
Figure 1E:
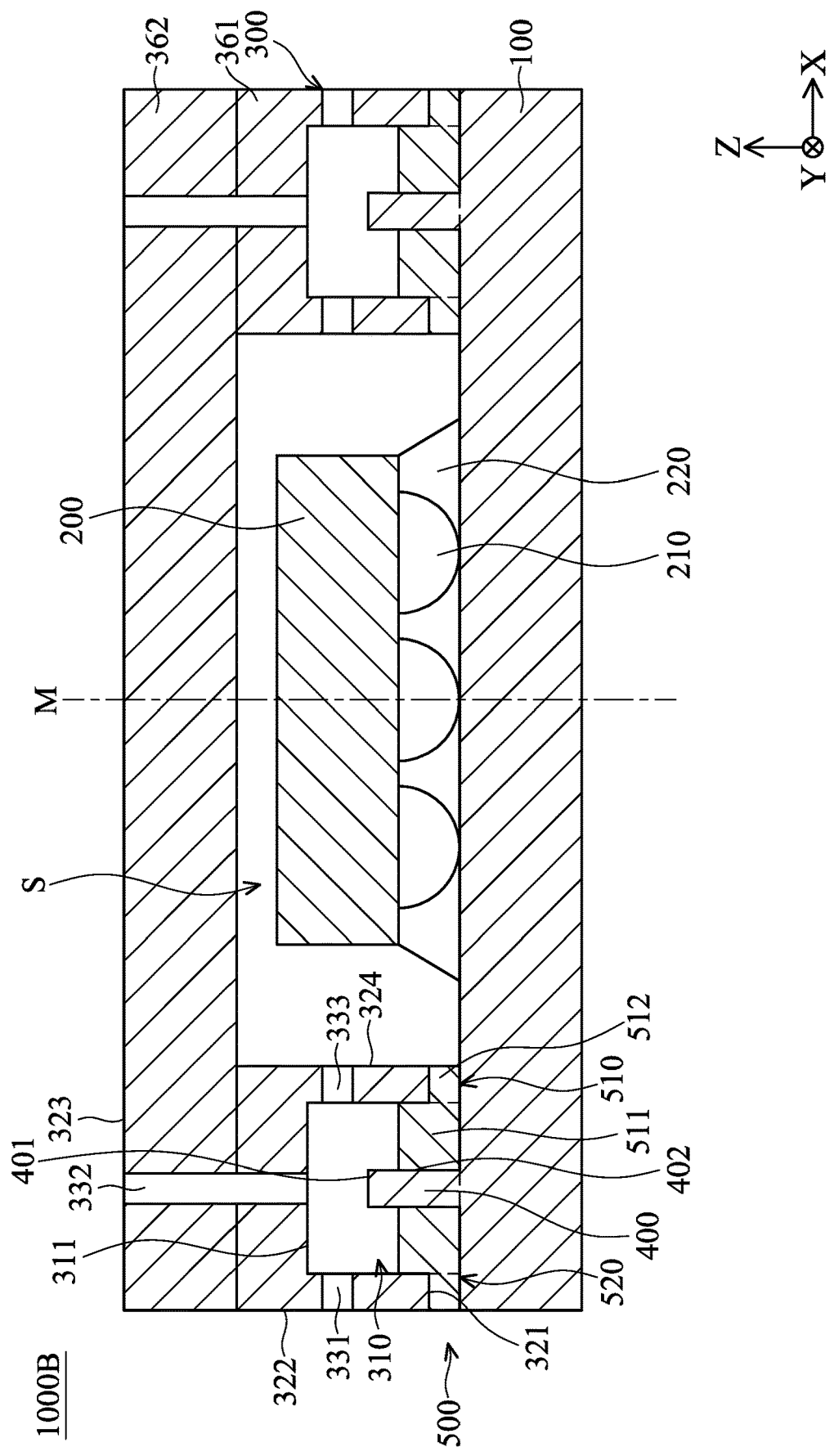
FIG. 1E is a cross-sectional view of a package structure in some embodiments of the present disclosure.

FIG. 1A is a schematic view of a package structure 1000 in accordance with some embodiments of the present disclosure. FIG. 1B is an exploded view of the package structure 1000. FIG. 1C is a top view of the package structure 1000. As shown in FIGS. 1A to 1C, The package structure 1000 includes a substrate 100, a semiconductor device 200, a cover element 300, a protruding element 400, and an adhesive element 500. Additional features can be added to the package structure 1000, and/or some of the features described below can be replaced or eliminated in other embodiments. FIG. 1D and FIG. 1E are cross-sectional views of package structures 1000A and 1000B illustrated along line A-A. In some embodiments, the package structures 1000A or 1000B may have similar elements to the package structure 1000.

The substrate 100 is used to provide electrical connection between semiconductor devices packaged in the package structure 1000 and an external electronic device (not shown). In some embodiments, the substrate 100 is a semiconductor substrate. By way of example, the material of the substrate 100 may include elementary semiconductor such as silicon or germanium; a compound semiconductor such as silicon germanium, silicon carbide, gallium arsenic, gallium phosphide, indium phosphide or indium arsenide; or combinations thereof.

Alternatively, the substrate 100 may be a silicon-on-insulator (SOI) substrate, a germanium-on-insulator (GOI) substrate, or the like. In some other embodiments, the substrate 100 is a printed circuit board (PCB), a ceramic substrate, or another suitable package substrate. The substrate 100 may be a core or a core-less substrate.

In some embodiments, the substrate 100 has various device elements (not shown). Examples of device elements that are formed in or on the substrate 100 may include transistors (e.g., metal oxide semiconductor field effect transistors (MOSFET), complementary metal oxide semiconductor (CMOS) transistors, bipolar junction transistors (BJT), high voltage transistors, high-frequency transistors, p-passage and/or n-passage field-effect transistors (PFETs/NFETs), etc.), diodes, resistors, capacitors, inductors, and/or other applicable device elements. Various processes can be performed to form the device elements, such as deposition, etching, implantation, photolithography, annealing, and/or other suitable processes. The substrate 100 may also have one or more circuit layers (not shown) used to electrically connect the device elements and semiconductor devices that are subsequently attached.

The substrate 100 generally has a rectangular (or square) shape in a top view (see FIG. 1C), depending on design requirements, although other shapes may also be used. Also, the substrate 100 has opposite surfaces 100A and 100B (shown in FIG. 1D), which may be substantially parallel to each other. The surface 100A (the upper surface shown) may be used to receive and bond other package components of the package, which will be described further below. Several electrical connectors (not shown) may be provided on the surface 100B (the lower surface shown) to enable electrical connection between the package structure 1000 and an external electronic device such as a PCB (not shown). The electrical connectors may be or include solder balls such as tin-containing solder balls.

In some embodiments, one semiconductor device 200 is disposed over a surface 100A (e.g., the upper surface shown) of the substrate 100, such as arranged along a main axis M, although more semiconductor devices may also be used. In some embodiments, the semiconductor device 200 is a functional integrated circuit (IC) die such as a semiconductor die, an electronic die, a Micro-Electro Mechanical Systems (MEMS) die, or a combination thereof. The functional IC die may include one or more application processors, logic circuits, memory devices, power management integrated circuits, analog circuits, digital circuits, mixed signal circuits, one or more other suitable functional integrated circuits, or a combination thereof, depending on actual needs. In some alternative embodiments, the semiconductor device 200 is a package module that has one or more semiconductor dies and an interposer substrate carrying these semiconductor dies. These structures of the semiconductor device 200 are well known in the art and therefore not described herein. The semiconductor device 200 can be fabricated by various processes such as deposition, etching, implantation, photolithography, annealing, and/or other suitable processes.

After being fabricated, the semiconductor device 200 may be placed in a desired location above the substrate 100 using, for example, a pick-and-place tool. In some embodiments, the semiconductor device 200 is placed eccentrically with respect to the substrate 100 depending on design requirements (such as consideration of space arrangements).

In some embodiments, the semiconductor device 200 is mounted on the substrate 100 through flip-chip bonding, although other suitable bonding techniques may also be used. As shown in FIG. 1D, the semiconductor device 200 is placed so that its active surface (e.g., the surface shown) faces the surface 100A of the substrate 100, and then is bonded onto the contact pads (not shown for simplicity) exposed at the surface 100A via electrical connectors 210. The electrical connectors 210 are used for electrically interconnecting the semiconductor device 200 with the substrate 100. The electrical connectors 210 may include conductive pillars, solder balls, controlled collapse chip connection (C4) bumps, micro bumps, one or more other suitable bonding structures, or a combination thereof.

In some embodiments, the electrical connectors 210 are made of or include a metal material, such as copper, aluminum, gold, nickel, silver, palladium, or the like, or a combination thereof. The electrical connectors 210 may be formed using an electroplating process, an electroless plating process, a placement process, a printing process, a physical vapor deposition (PVD) process, a chemical vapor deposition (CVD) process, a photolithography process, one or more other applicable processes, or a combination thereof. In some other embodiments, the electrical connectors 210 are made of or include a tin-containing material. The tin-containing material may further include copper, silver, gold, aluminum, lead, one or more other suitable materials, or a combination thereof. In some other embodiments, the electrical connectors 210 are lead-free. A reflow process may be performed in order to shape the tin-containing material into the desired bump or ball shapes.

In some embodiments, an underfill layer 220 is also formed to surround and protect the electrical connectors 210, and enhances the connection between the semiconductor device 200 and the substrate 100, as shown in FIG. 1D. The underfill layer 220 may be made of or include an insulating material such as an underfill material. The underfill material may include an epoxy, a resin, a filler material, a stress release agent (SRA), an adhesion promoter, another suitable material, or a combination thereof.

In some embodiments, an underfill material in liquid state is dispensed into a gap between the semiconductor device 200 and the substrate 100 to reinforce the strength of the electrical connectors 210 and therefore the overall package structure. After the dispensing, the underfill material is cured to form the underfill layer 220. In some other embodiments, the underfill layer 220 is not formed.

In some embodiments, the package structure 1000 also includes electrical connectors, such as solder balls (not shown for simplicity), formed over the surface 100B (e.g., the lower surface shown) of the substrate 100. The solder balls are electrically connected to the electrical connectors 210 through the circuit layer(s) of the substrate 100. The solder balls enable an electrical connection to be made between the package structure 1000 and an external electronic device such as a PCB (not shown).

In some embodiments, the cover element 300 is disposed over the surface 100A of the substrate 100, and is arranged along the periphery of the substrate 100. In some embodiments, the cover element 300 has a rectangular or square ring shape in a top view, depending on the shape of the substrate 100. In some embodiments, the cover element of the package structure is a lid structure. For example, FIG. 1D is a cross-sectional view of a package structure 1000A in some embodiments of the present disclosure. In some embodiments, the package structure 1000A has a cover element 300 that has a ring portion 306 and a main body 350 surrounded by the ring portion 306. In some embodiments, the main body 350 covers the semiconductor device 200 in the Z direction, and the second channel 332 penetrated from the recess 310 to the third surface 323.

In some embodiments, the ring portion 306 surrounds a space S, and the semiconductor device 200 is disposed in the space S. In some embodiments, the ring portion 306 has a first surface 321, a second surface 322, a third surface 323, and a fourth surface 324, and the space S is surrounded by the fourth surface 324. The first surface 321 faces the surface 100A of the substrate 100, and the third surface 323 faces away from the surface 100A of the substrate 100 and may be parallel to the first surface 321. The second surface 322 may be substantially aligned with the edge 100C of the substrate 100, and the fourth surface 324 of the cover element 300 may be adjacent to and surround sidewalls of the semiconductor device 200, as shown in FIG. 1D. The cover element 300 may be configured as a stiffener ring or a lid structure, and used to constrain the substrate 100 to alleviate its warpage and/or to enhance robustness of the substrate 100. In some embodiments, the material of the cover element 300 may include metal such as copper, stainless steel, stainless steel/Ni, or the like, but is not limited thereto. In some embodiments, the ring portion 306 and the main body 350 of the package structure 1000A in FIG. 1D are formed as one piece.

In some embodiments, the cover element is formed by combining a ring portion and a cover lying on the ring portion. For example, FIG. 1E is a cross-sectional view of a package structure 1000B in some embodiments of the present disclosure. As shown in FIG. 1E, the cover element 300 includes a ring portion 361 and a cover 362 lying on the ring portion 361. In some embodiments, the ring portion 361 and the cover 362 are formed separately and then combined by, for example, adhesive.

In some embodiments, an adhesive element 500 is interposed between the first surface 321 of the cover element 300 and the surface 100A of the substrate 100. The adhesive element 500 may be configured to bond the cover element 300 to the substrate 100. The adhesive element 500 may be applied to the surface 100A and/or the first surface 321 before installing the cover element 300 on the substrate 100. Examples of the material for the adhesive element 500 may include organic adhesive material such as epoxy, polyimide (PI), polybenzoxazole (PBO), benzo-cyclo-butene (BCB), but are not limited thereto.

The above-mentioned various package components and substrate materials used in the package structure 1000 may have different coefficient of thermal expansions (CTEs). Hence, when the package undergoes thermal cycling during package assembly, reliability testing, or filed operation, the package components and substrate materials may expand at different rates, causing the substrate 100 tends to warp. The cover element 300 may reduce some extent this warpage, but since the cover element 300 constrains the substrate 100, this constraining force produces stress in the substrate 100. It has been observed that the generated stress is typically concentrated in die corner areas and the die-to-die areas, which will cause cracks to easily occur in the used underfill element(s) and/or the used molding layer corresponding to these areas, thereby inducing the reliability issues.

Therefore, what is needed is a package structure that can address the above issue of stress concentration in specific areas (especially in the die corner areas and the die-to-die areas) of the package. The following will describe package structure design provided in accordance with some embodiments, which can be used to relieve stress generated in these areas of the package during thermal cycling.

In some embodiments, the cover element 300 includes a recess 310 formed on the first surface 321 of the cover element 300. The protruding element 400 is extending from the surface 100A of the substrate 100 and having a top surface 401 facing the cover element 300, and the protruding element 400 is disposed in the recess 310. As shown in FIG. 1C, the semiconductor device 200 is surrounded by the recess 310 and the protruding element 400. The protruding element 400 may have a stud-liked or a wall-liked structure, and the material of the protruding element 400 includes metal. A portion of the protruding element 400 may be embedded in the substrate 100 (not shown), and the protruding element 400 is separated from the cover element 300. For example, the cover element 300 and the protruding element 400 are separated by the adhesive element 500. In some embodiments, the adhesive element 500 is in contact with a side surface 402 of the protruding element 400 to separate the protruding element 400 from the cover element 300.

In some embodiments, the recess 310 has a width W1, and the protruding element 400 has a width W2 in a first direction (the X direction). The width W1 is greater than the width W2 to ensure the protruding element 400 is accommodated in the recess 310. In some embodiments, the width W1 is greater than 150 µm, and the width W2 is greater than 50 µm and less than 500 µm to let the protruding element 400 being accommodated in the recess 310. In some embodiments, the recess 310 may be replaced by holes.

In some embodiments, the adhesive element 500 includes an inner portion 510 and an outer portion 520 separated by the protruding element 400. Either the inner portion 510 or the outer portion 520 has a portion directly under the first surface 321 of the cover element 300 and another portion in the recess 310. For example, the inner portion 510 includes a first inner portion 511 and a second inner portion 512. The first inner portion 511 is in contact with the side surface 402 of the protruding element 400, and the second inner portion 512 is separated from the side surface 402 of the protruding element 400 by the first inner portion 511. The first inner portion 511 has a height H1, and the second inner portion 512 has a height H2. In some embodiments, the height H1 is greater than the height H2. In some embodiments, the protruding element 400 has a height H3, and the height H3 is greater than the height H1 and the height H2. Therefore, the top surface 401 and a portion of the side surface 402 of the protruding element 400 are exposed from the adhesive element 500 in some embodiments. In some embodiments, the height H3 is greater than 100 µm to for providing a higher contact area with the adhesive element 500.

In some embodiments, the recess 310 includes a recess bottom surface 311, and a distance between the adhesive element 500 (e.g. the second inner portion 512) and the recess bottom surface 311 in the normal direction of the substrate 100 (i.e. the Z direction) is D1. The distance D1 is greater than zero, which means the adhesive element 500 is separated from the recess bottom surface 311, and the space in the recess 310 is not totally filled by the adhesive element 500.

In some embodiments, additional channels may be provided on the cover element 300 to connect the recess 310 to external environments. For example, as shown in FIGs. 1A to 1E, the cover element 300 includes first channels 331, second channels 332, and third channels 333. The first channels 331 connect the recess 310 and the second surface 322 of the cover element 300. The second channels 332 connect the recess 310 and the third surface 323 of the cover element 300. The third channels 333 connect the recess 310 and the fourth surface 324 of the cover element 300. Therefore, the recess 310 is in fluid connect with external environment, so when the cover element 300 is installed on the substrate 100, air in the recess 310 may be exhausted, so the adhesive element 500 may have better coverage.

Figure 2A:
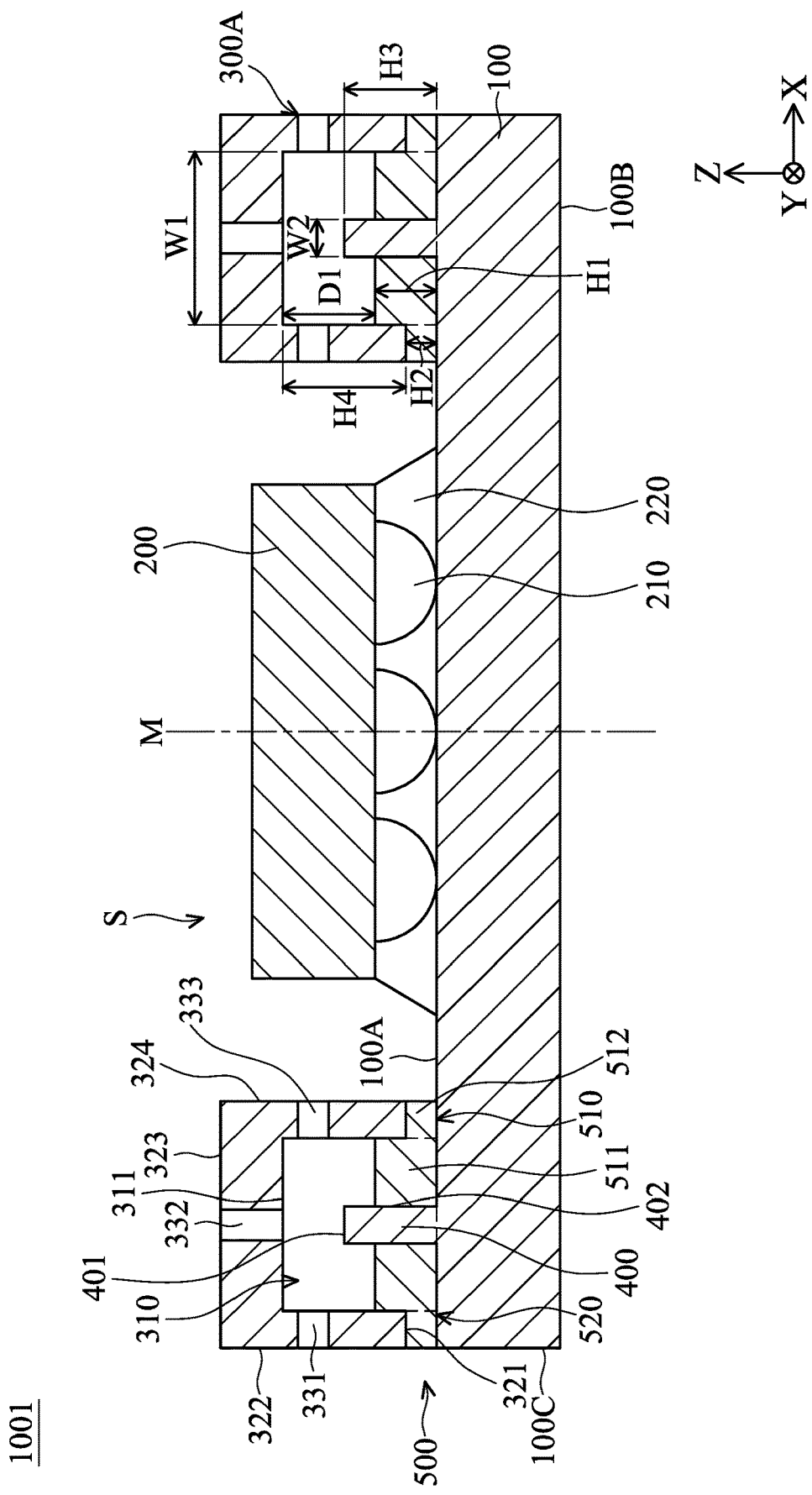
FIG. 2A to FIG. 2E are cross-sectional views of some package structures having cover elements in accordance with some embodiments of the present disclosure.

In some embodiments, the cover element is a ring structure. FIG. 2A is a cross-sectional view of a package structure 1001. In some embodiments, a cover element 300A of the package structure 1001 is a ring structure, and the semiconductor device 200 is exposed from and surrounded by the cover element 300A. In some embodiments, the cover element 300A includes first channels 331, second channels 332, and third channels 333 connected to the recess 310 to allow the recess 310 in fluid connect with external environment.

In some embodiments, some of the first channels 331, the second channels 332, or the third channels 333 may be omitted. For example, FIG. 2B to FIG. 2E are cross-sectional views of other package structures having cover elements different from the cover element 300 or the cover element 300A described in the aforementioned embodiments.

Figure 2B:
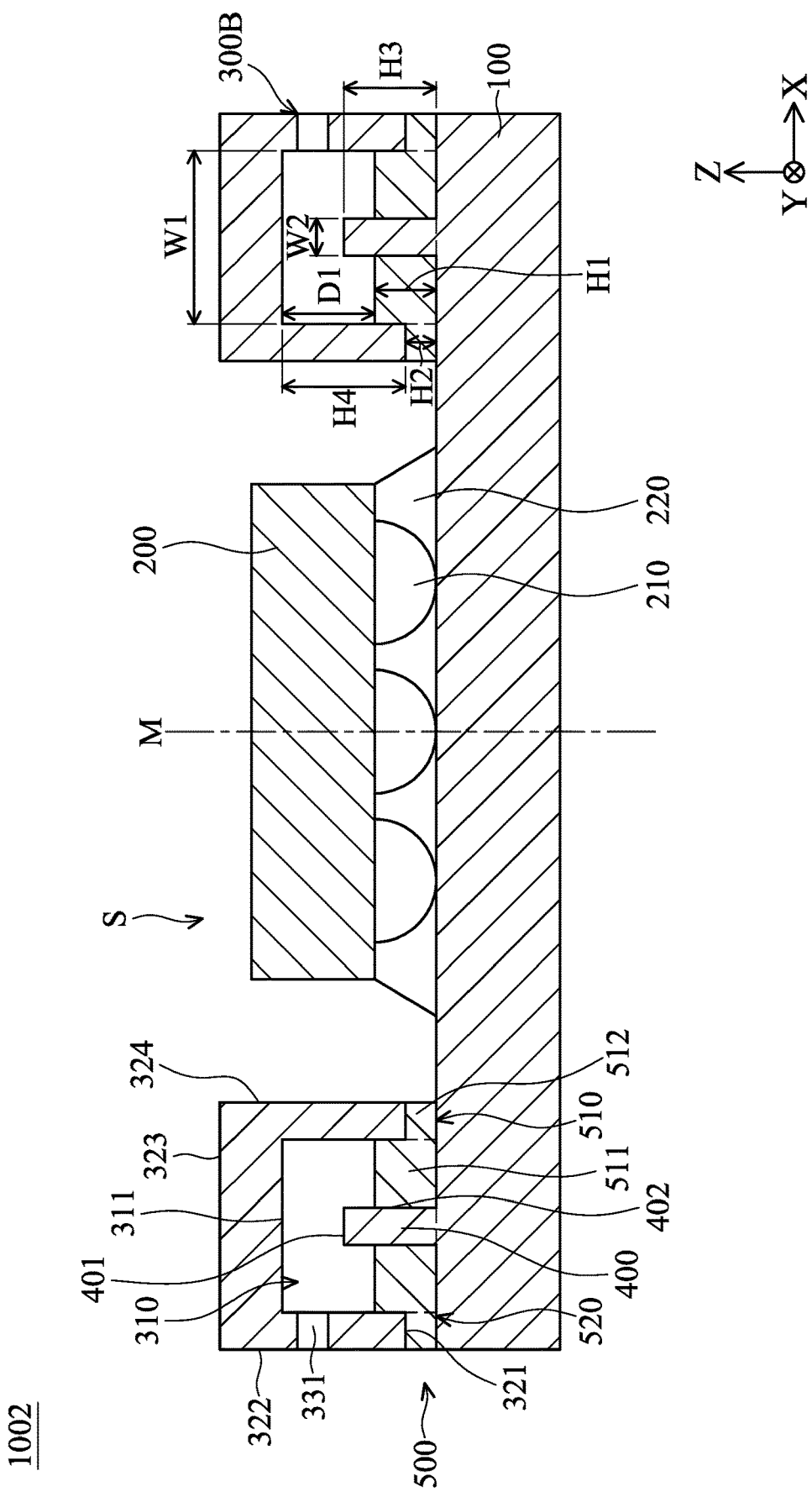
Figure 2C:
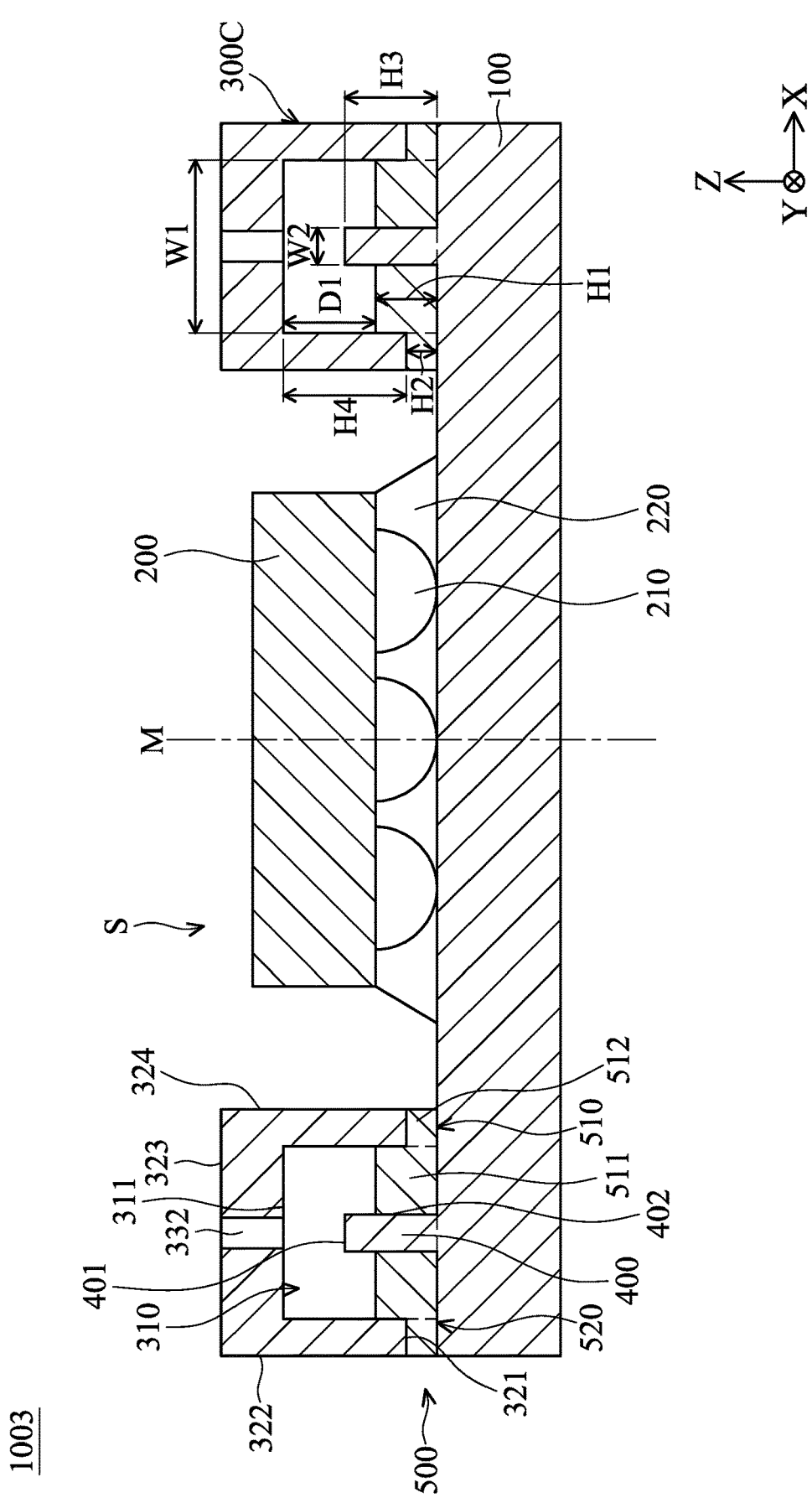
Figure 2D:
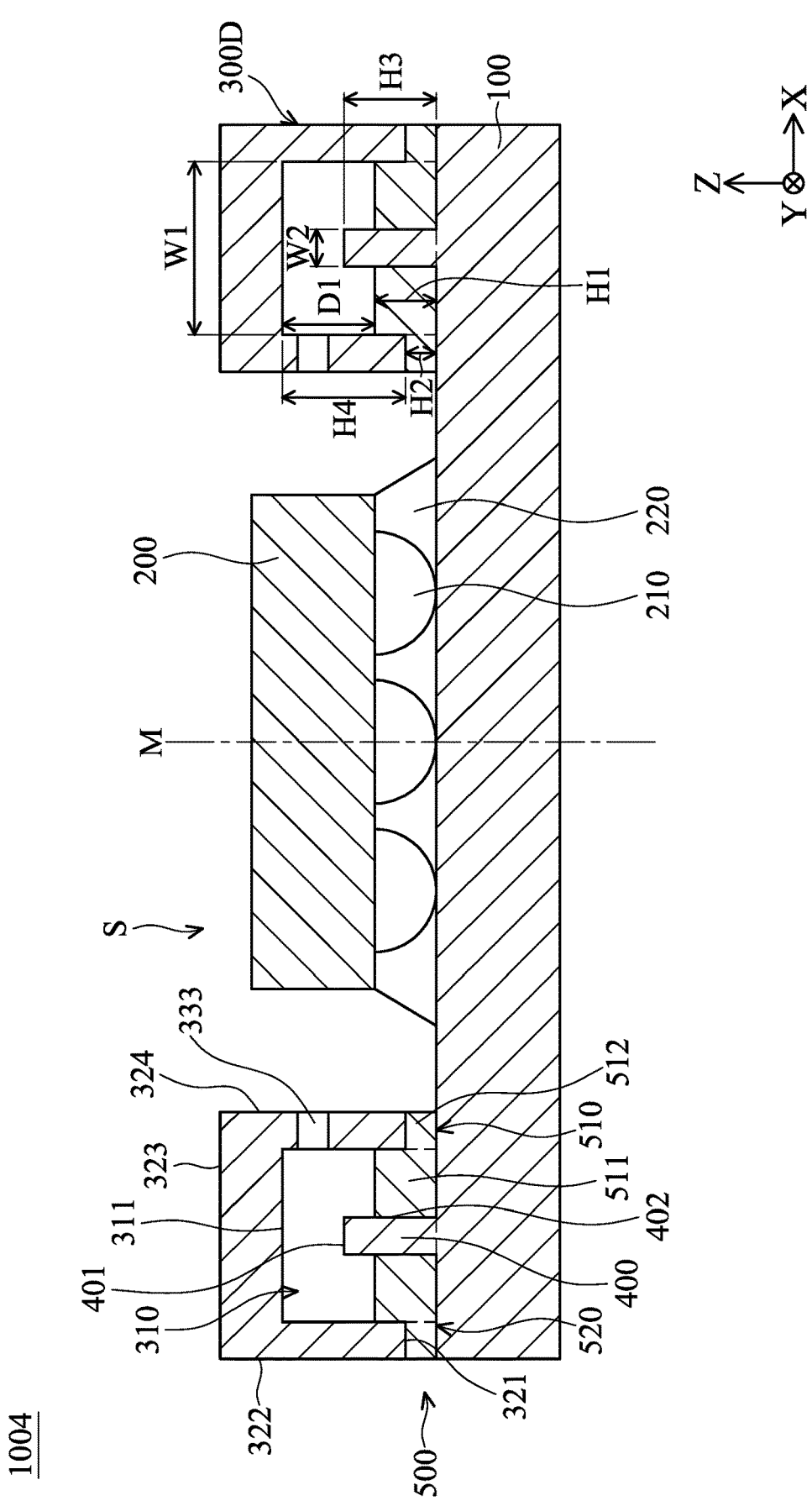
Figure 2E:
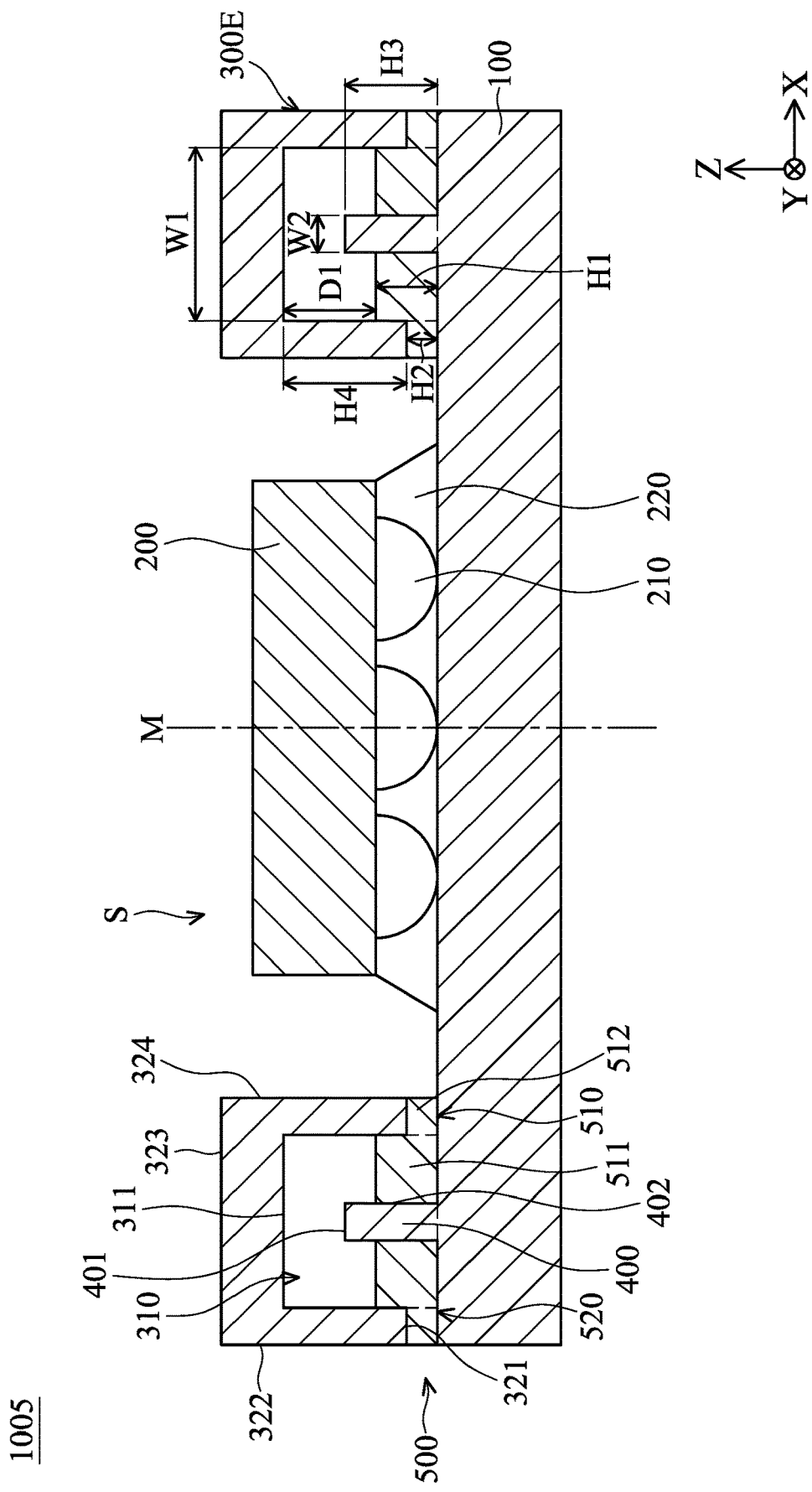

As shown in FIG. 2B, a cover element 300B of a package structure 1002 includes first channels 331, but the second channels 332 and the third channels 333 are omitted. As shown in FIG. 2C, a cover element 300C of a package structure 1003 includes second channels 332, but the first channels 331 and the third channels 333 are omitted. As shown in FIG. 2D, a cover element 300D of a package structure 1004 includes third channels 333, but the first channels 331 and the second channels 332 are omitted. As shown in FIG. 2E, no channel is provided to connect the recess 310 and the external environment.

In some embodiments, the first channels 331, the second channels 332, and the third channels 333 may be separated from the adhesive element 500 by the cover element 300A. In other words, the first channels 331, the second channels 332, and the third channels 333 may be kept in fluid communication with external environment.

Figure 3A:
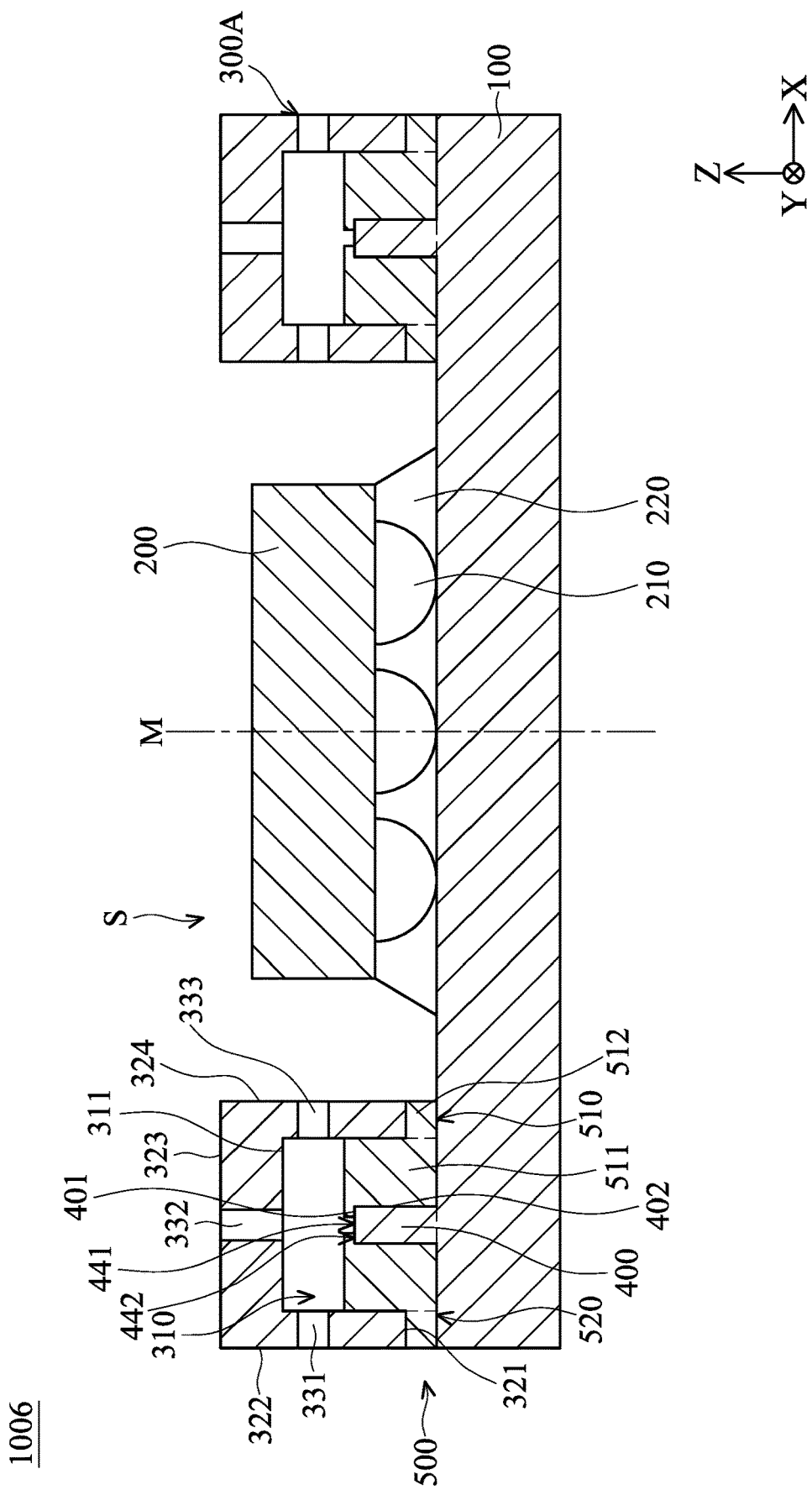
FIG. 3A is a cross-sectional view of a package structure in some embodiments of the present disclosure.

In some embodiments, the adhesive 500 covers a portion of the top surface 401 of the protruding element 400. FIG. 3A is a cross-sectional view of a package structure 1006 in some embodiments of the present disclosure. As shown in FIG. 3A, a first portion 441 of the top surface 401 is exposed from the adhesive element 500, and the adhesive element 500 covers a second portion 442 of the top surface 401.

Figure 3B:
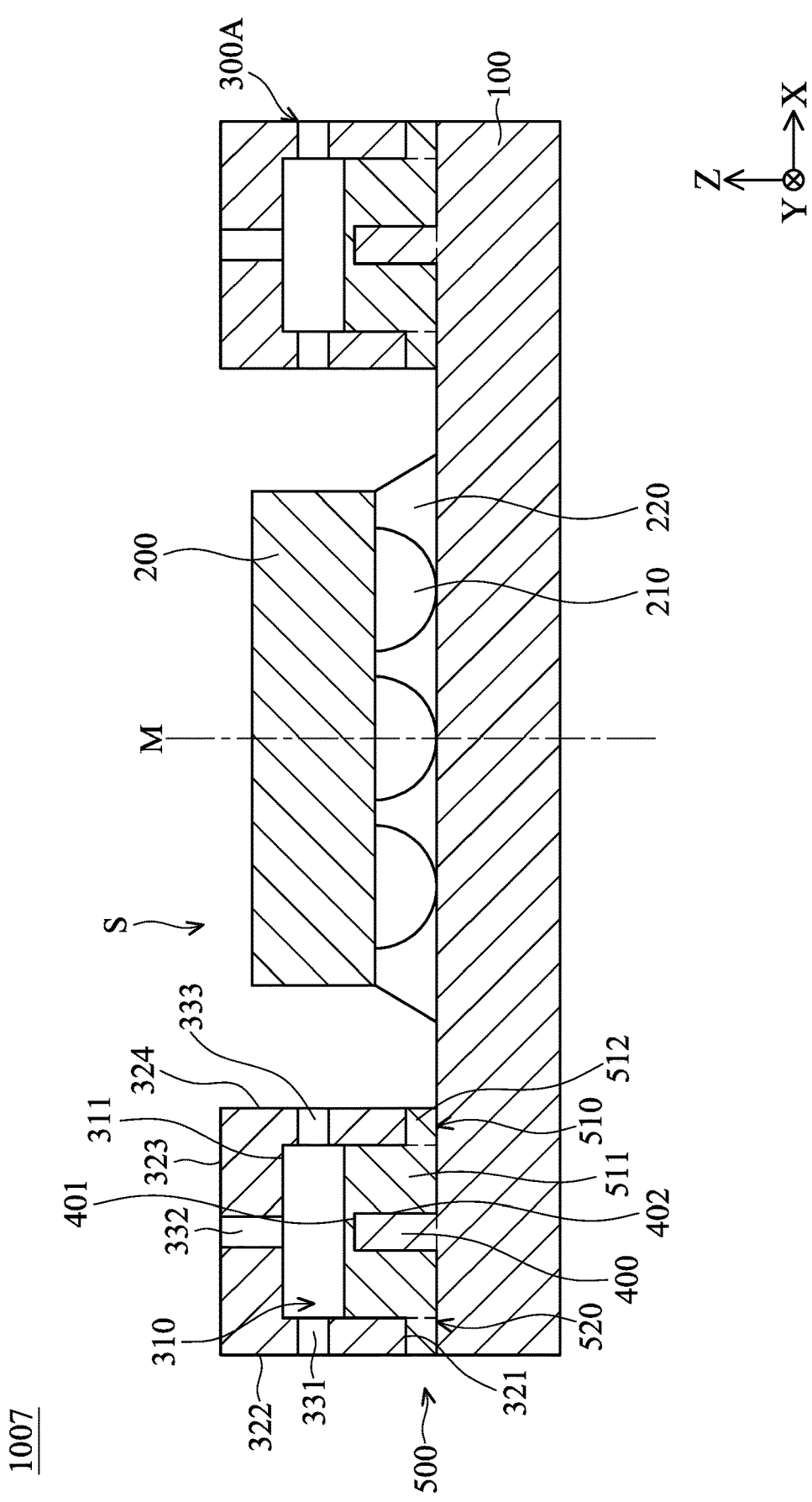
FIG. 3B is a cross-sectional view of a package structure in some embodiments of the present disclosure.

In some embodiments, the adhesive element 500 covers the entire top surface 401 of the protruding portion 400 which faces the cover element 300A. For example, FIG. 3B is a cross-sectional view of a package structure 1006 in some embodiments of the present disclosure. As shown in FIG. 3B, the entire top surface 401 of the protruding element 400 is covered by the adhesive element 500. It should be noted that the adhesive element 500 is not in the first channels 331, the second channels 332, or the third channels 333 to ensure air in the recess 310 is in fluid connect with external environment.

Figure 4:
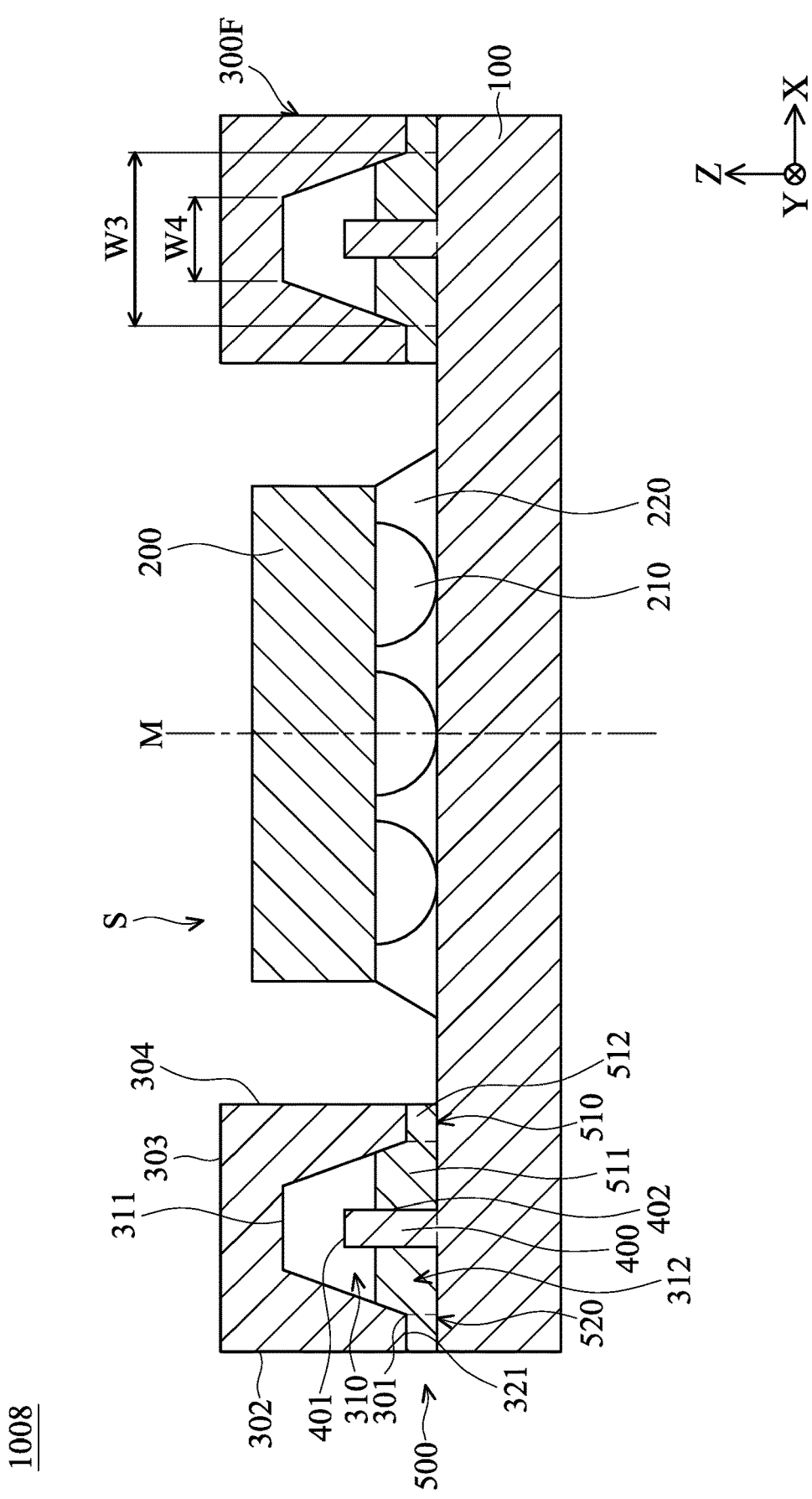
FIG. 4 is a cross-sectional view of a package structure in some embodiments of the present disclosure.

FIG. 4 is a cross-sectional view of a package structure 1008 in some embodiments of the present disclosure. In some embodiments, an opening 312 of the recess 310 formed on the first surface 321 and the recess bottom surface 311 face an identical direction (e.g. —Z direction). In some embodiments, the opening 312 has a first width W3 in a first direction (e.g. X direction), the recess bottom surface 311 has a second width W4 in the first direction, and the first width W3 is greater than the second width W4. In other words, the recess 310 has a trapezoidal shape in cross-sectional view in some embodiments of the present disclosure.

Figure 5A:
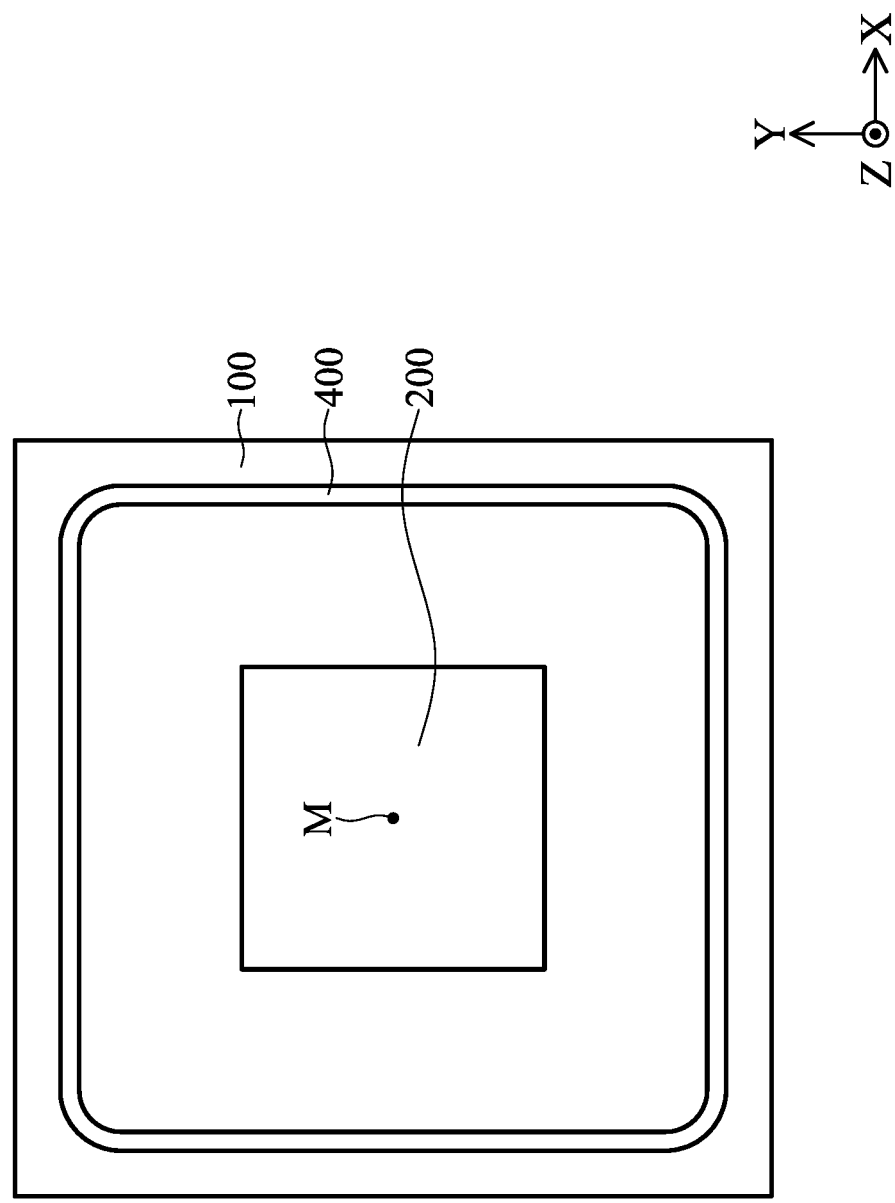
FIG. 5A to FIG. 5D are top views showing different protruding elements in some embodiments of the present disclosure.

FIG. 5A to FIG. 5D are top views showing different protruding elements in some embodiments of the present disclosure. In FIG. 5A, the protruding element 400 has a continuous structure that surrounds the semiconductor device 200. In some embodiments, the shape of the protruding element 400 includes rectangular or circle.

Figure 5B:
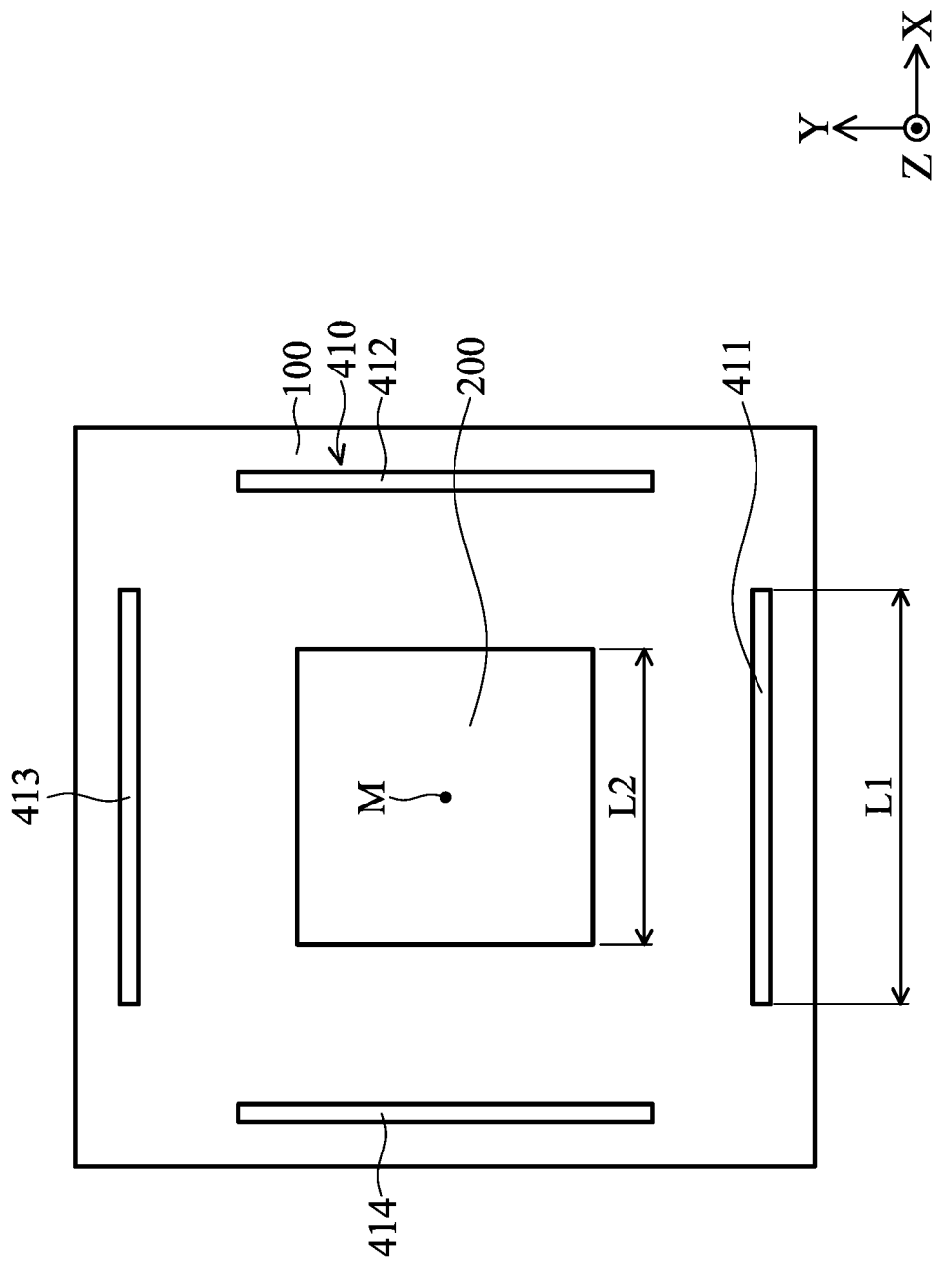

FIG. 5B shows the configuration of a protruding element 410 in some embodiments of the present disclosure. The protruding element 410 has several protruding portions extending in various directions. For example, the protruding element 410 has a first protruding portion 411, a second protruding portion 412, a third protruding portion 413, and a fourth protruding portion 414. The first protruding portion 411 and the third protruding portion 413 extend in a first direction (e.g. the X direction), and the second protruding portion 412 and the fourth protruding portion 414 extend in a second direction (e.g. the Y direction).

In some embodiments, the semiconductor device 200 is surrounded by the first protruding portion 411, the second protruding portion 412, the third protruding portion 413, and the fourth protruding portion 414 of the protruding element 410. In some embodiments, the first protruding portion 411, the second protruding portion 412, the third protruding portion 413, and the fourth protruding portion 414 are continuous lines, and each of the lengths of the first protruding portion 411, the second protruding portion 412, the third protruding portion 413, and the fourth protruding portion 414 is greater than the length of the semiconductor device 200. For example, the first protruding portion 411 has a length L1 in the X direction, the semiconductor device 200 has a length L2 in the X direction, and the length L1 is greater than the length L2. Therefore, the semiconductor device 200 is surrounded by the protruding element 410.

Figure 5C:
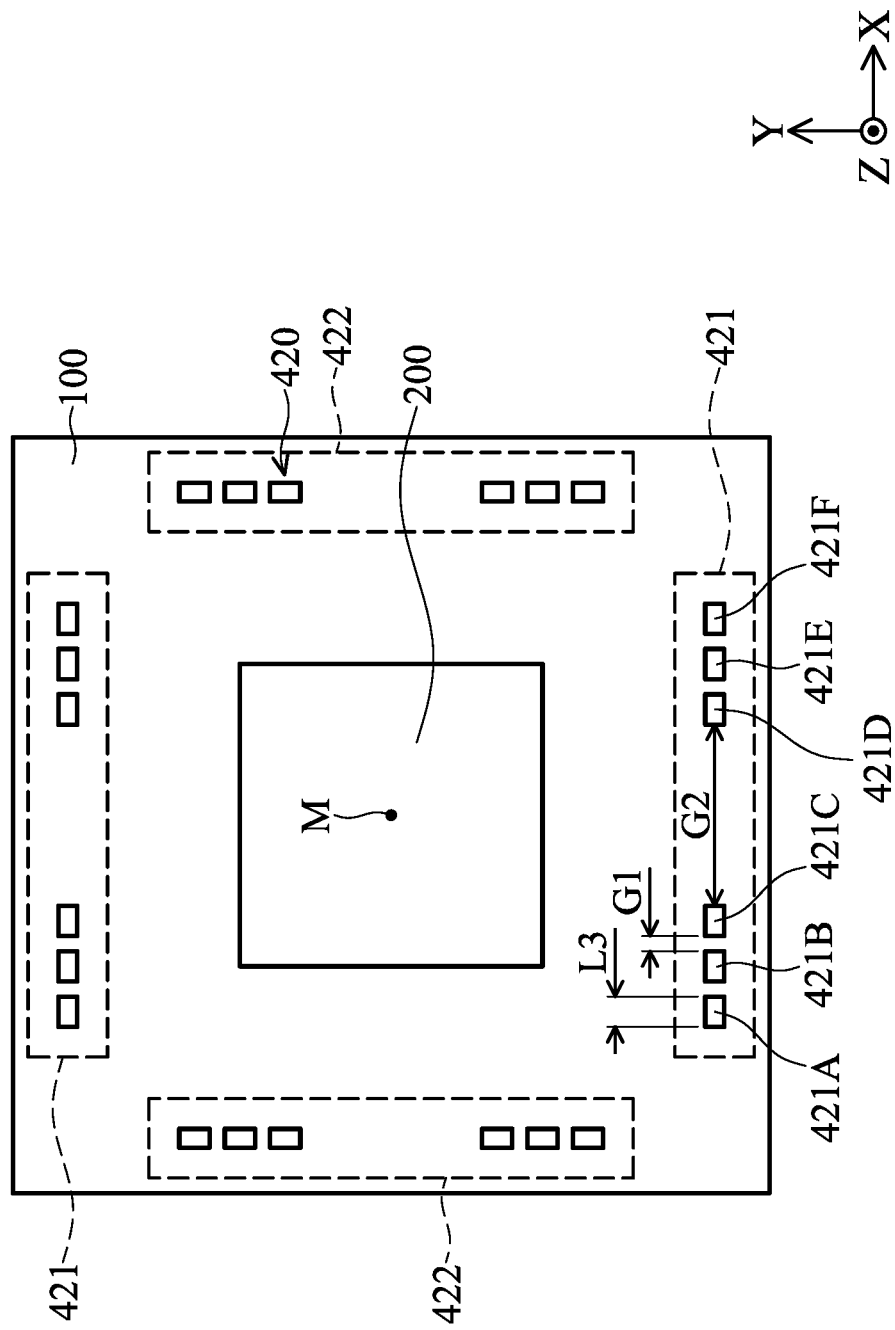

In some embodiments, the protruding element has a combination of discontinue lines. For example, FIG. 5C shows the configuration of protruding element 420. The protruding element 420 has first protruding portions 421 and second protruding portions 422. Each of the first protruding portions 421 and the second protruding portions 422 has several sub-portions that extend in an identical direction. For example, the first protruding portion 421 has sub-portions 421A, 421B, 421C, 421D, 421E, and 421F extending in the X direction. In some embodiments, the sub-portions are spaces apart with different gaps. For examples, a gap G1 is between the sub-portions 421B and 421C, a gap G2 is between the sub-portions 421C and 421D, and the gap G1 and the gap G2 are different. For example, the gap G2 is greater than the gap G1 in some embodiments of the present disclosure. In some embodiments, the length of each of the sub-portions is greater than 50 μm. For example, the sub-portion 421A has a length L3 in the X direction, and the length L3 is greater than 50 μm to increase the contact area with the adhesive element 500.

Figure 5D:
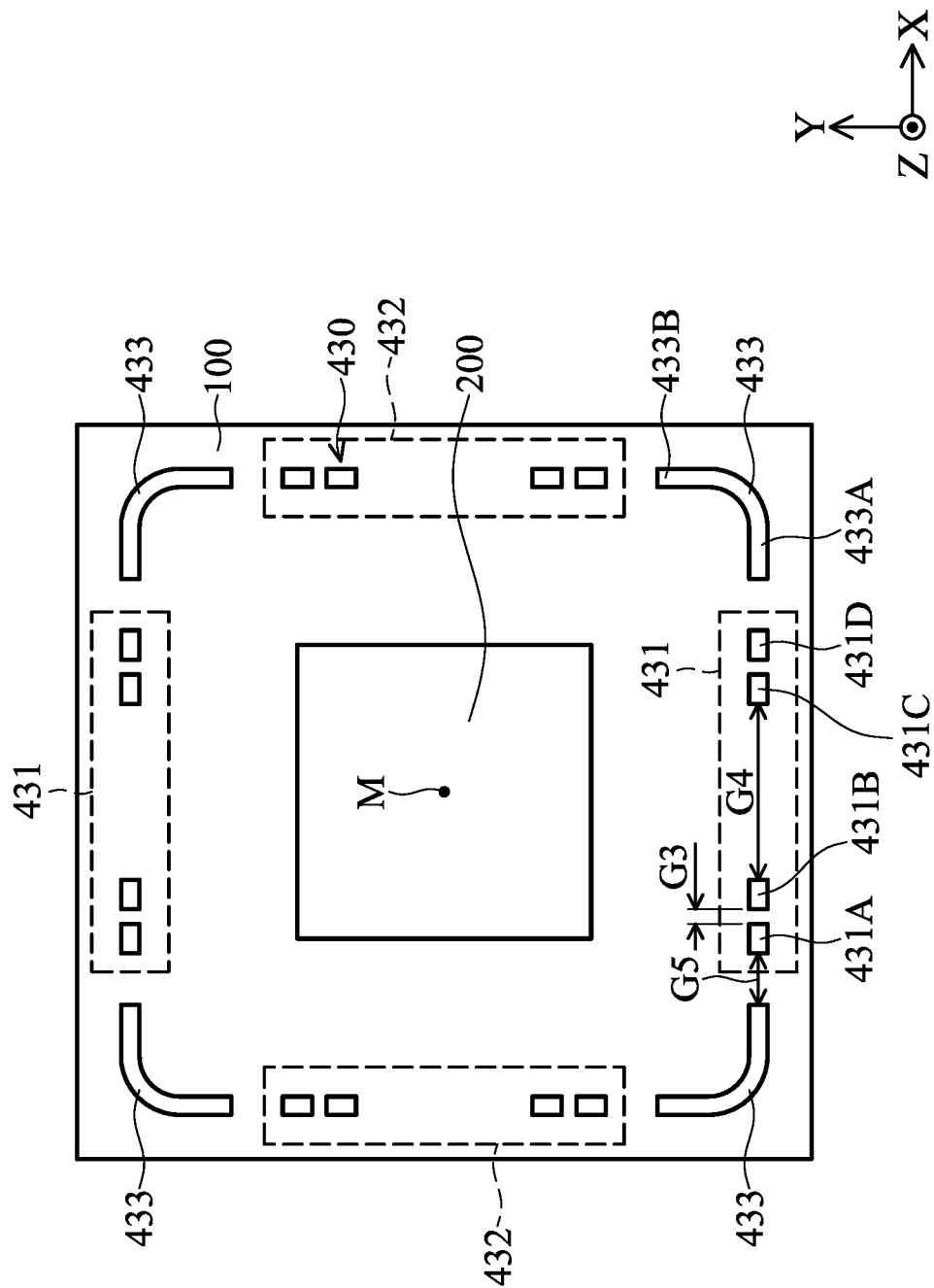
Figure 5E:
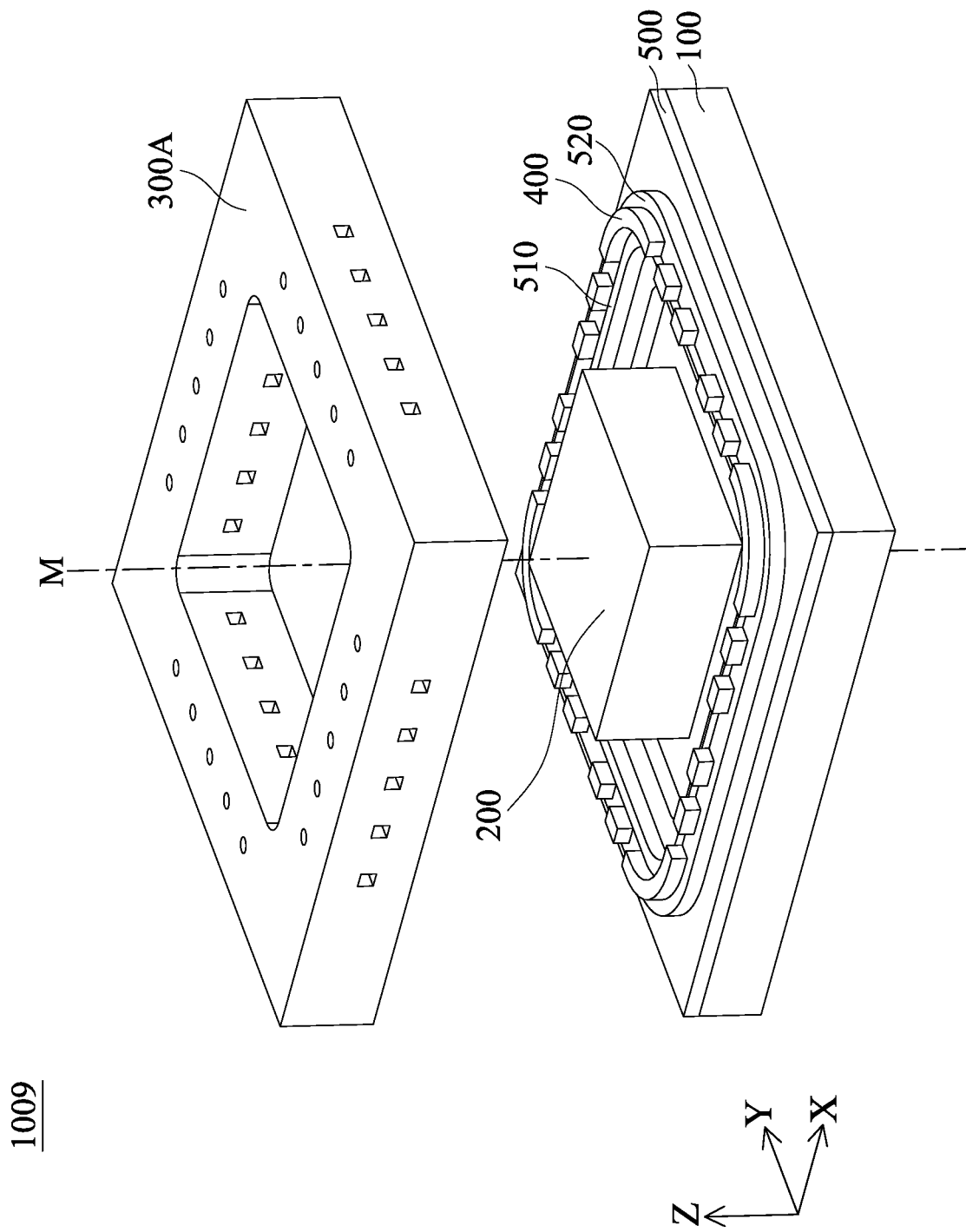
FIG. 5E is a perspective view showing a package structure having a protruding element.

In some embodiments, a protruding portion that has two ends extending in different directions may be provided in some embodiments of the present disclosure. For example, FIG. 5D is a top view showing the configuration of a protruding element 430, and FIG. 5E is a perspective view showing a package structure 1009 having the protruding element 430. The protruding element 430 has a first protruding portion 431, a second protruding portion 432, and a third protruding portion 433. The first protruding portion 431 and the second protruding portion 432 are linear-shaped, the first protruding portion 431 extends in the X direction, and the second protruding portion 432 extends in the Y direction. The third protruding portion 433 is disposed between the first protruding portion 431 and the second protruding portion 432, and has a first end 433A and a second end 433B. The first end 433A and the second end 433B extend in different directions. For example, the first end 433A extends in the X direction, and the second end 433B extends in the Y direction the in some embodiments of the present disclosure. In some embodiments, the first protruding portion 431 and the first end 433A of the third protruding portion 433 are aligned in the X direction, and the second protruding portion 432 and the second end 433B of the third protruding portion 433 are aligned in the Y direction.

In some embodiments, the first protruding portion 431 has sub-portions 431A, 431B, 431C, and 431D sequentially arranged in the X direction. In some embodiments, a gap G3 is between the sub-portion 431A and the sub-portion 431B, a gap G4 is between the sub-portion 431B and the sub-portion 431C, and the gap G3 and the gap G4 are different. For example, the gap G4 may be greater than the gap G3. In some embodiments, a gap G5 is between the sub-portion 431D of the first protruding portion 431 and the first end 433A of the third protruding portion 433, and the gap G5 is different from the gap G3 and the gap G4 the in some embodiments of the present disclosure. For example, the gap G5 is greater than the gap G3 and less than the gap G4 in some embodiments of the present disclosure. The third protruding portion 433 at the corners of the substrate 100 allows the stress concentrated at the corners of the substrate 100 being released to enhance the reliability of the package structure.

Figure 6A:
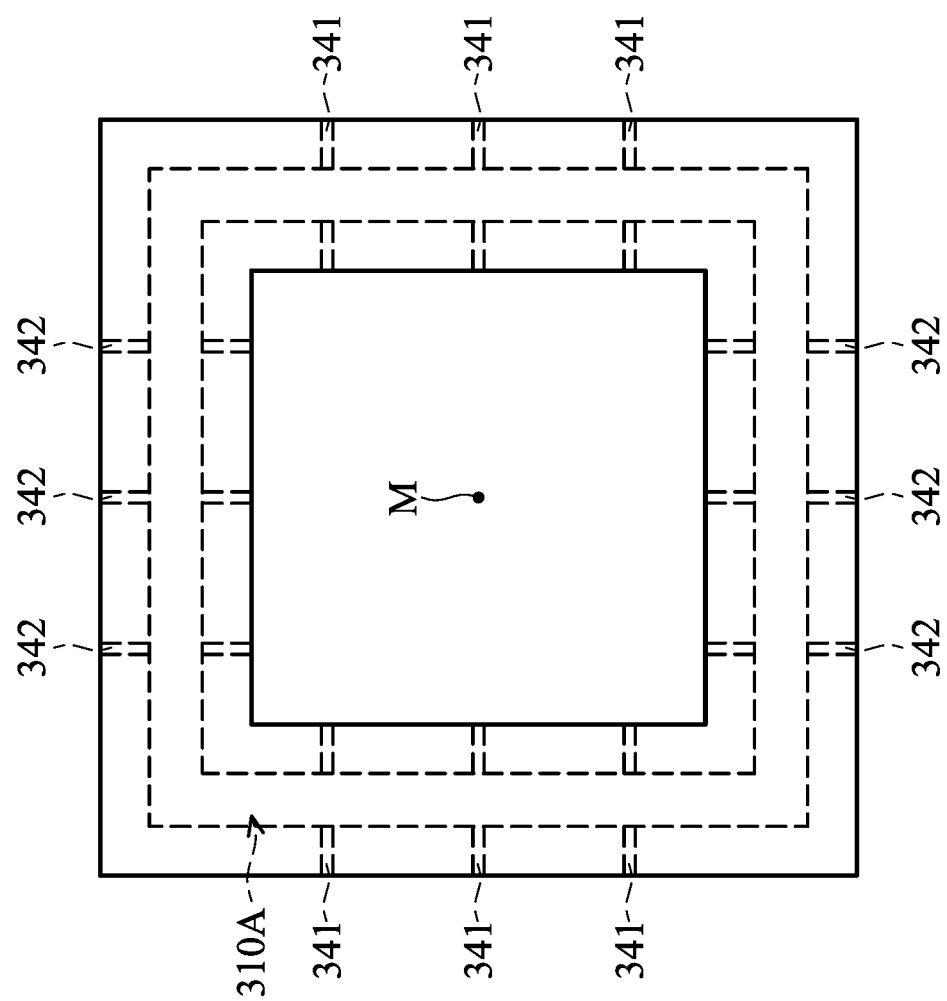
Figure 6C:
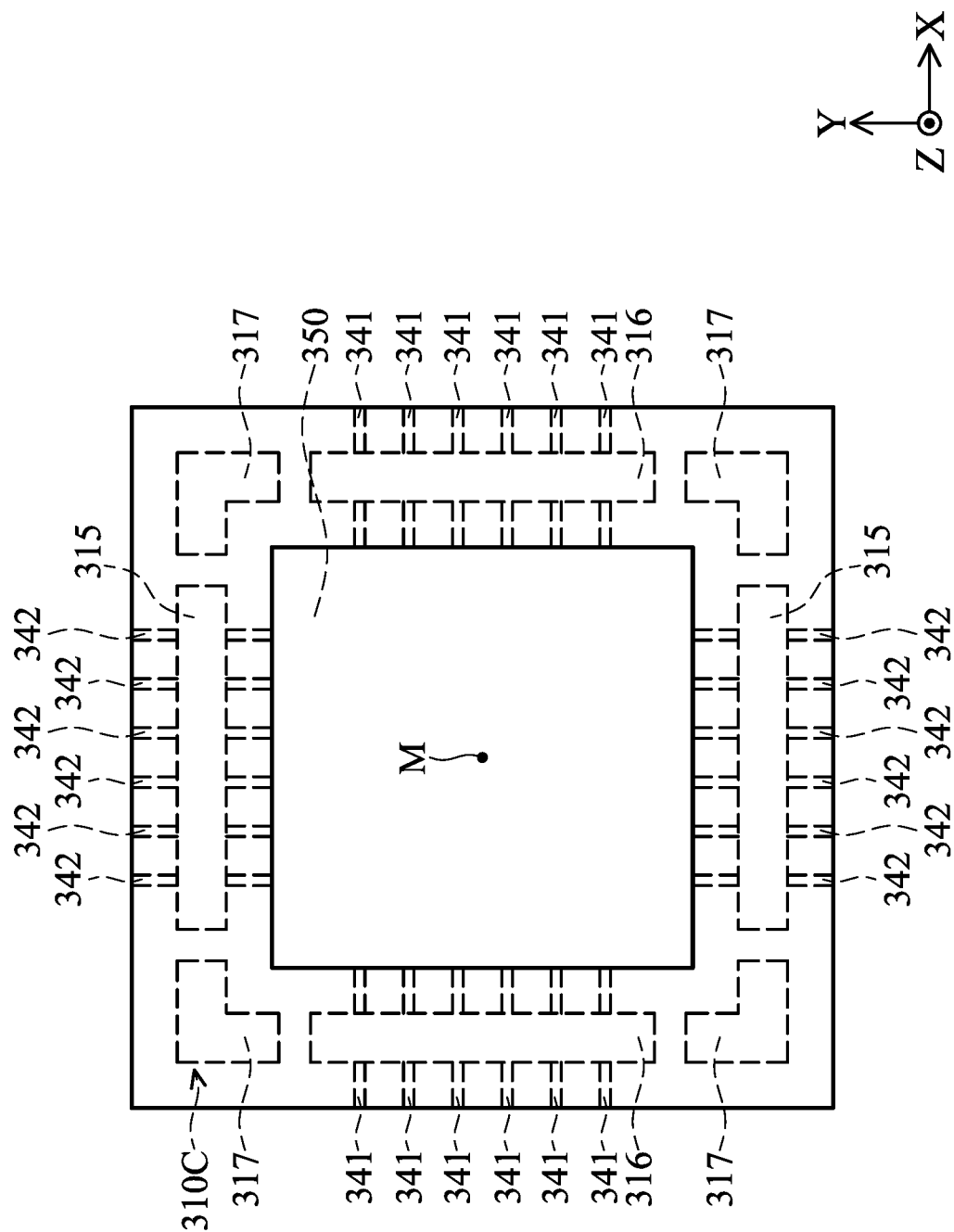

FIG. 6A to FIG. 6C are top views showing different cover elements in some embodiments of the present disclosure. For example, FIG. 6A is a top view of the cover element 300A in some embodiments of the present disclosure. The recess 310A of the cover element 300A has a continuous rectangular shape or a circular shape that surrounds the main axis M in some embodiments of the present disclosure. The cover element 300A has channels 341 and 342 that are in fluid connected to the recess 310A. For example, the channel 341 or the channel 342 includes the first channel 331 and the third channel 333 in FIG. 2A. The second channel 332 is omitted from the cover elements in FIG. 6A to FIG. 6C for simplicity, but it should be noted that the second channel 332 that extends in the Z direction is also applicable in the cover elements in the embodiments in FIG. 6A to FIG. 6C, depending on design requirement. In some embodiments, the channels 341 and 342 extend in different directions. For example, the channels 341 extend in the X direction, and the channels 342 extend in the Y direction. In some embodiments, the channels 341 and 342 are perpendicular to the recess 310A in the top view. Therefore, the air in the recess 310A is allowed to be exhausted from the channels 341 or the 342 when the cover element 300A is disposed on the substrate.

In some embodiments, the recess of the cover element has a discontinuous structure. For example, FIG. 6B shows a cover element 301 having a recess 310B and channels 341 and 342 that are in fluid communication with the recess 310B in some embodiments of the present disclosure. The recess 310B includes first recess portions 313 and second recess portions 314. The first recess portions 313 extend in the X direction, and the second recess portions 314 extend in the Y direction. The first recess portion 313 has a length L4 in the X direction. In some embodiments, the length of the recess portion is greater than the protruding portion. For example, when the cover element 301 is assembled with the substrate 100 having the protruding element 410 in FIG. 5B, the length L4 of the first recess portion 313 is greater than the length of the first protruding portion 411 to allow the first protruding portion 411 being accommodated in the first recess portion 313. In some embodiments, the length L4 is greater than 50 µm. The second recess portion 314 and the second protruding portion 412 have similar structural relationship in some embodiments of the present disclosure, and it is not repeated. In some embodiments, the channel 341 extends in the first direction (X direction) and is connected to the second recess portion 314 extending in the Y direction, and the channel 342 extends in the second direction (Y direction) and is connected to the first recess portion 313 extending in the X direction.

In some embodiments, the recess of the cover element has a portion at corners of the cover element. For example, FIG. 6C is a top view of a cover element 302 in some embodiments of the present disclosure. The cover element 302 has a recess 310C and channels 341 and 342 that are in fluid communication with the recess 310C in some embodiments of the present disclosure. The recess 310C includes first recess portions 315, second recess portions 316, and third recess portions 317. The first recess portions 315 extend in the X direction, the second recess portions 316 extend in the Y direction, and the third recess portions 317 are between the first recess portions 315 and the second recess portions 316, and form at corners of the cover element 302.

Figure 6D:
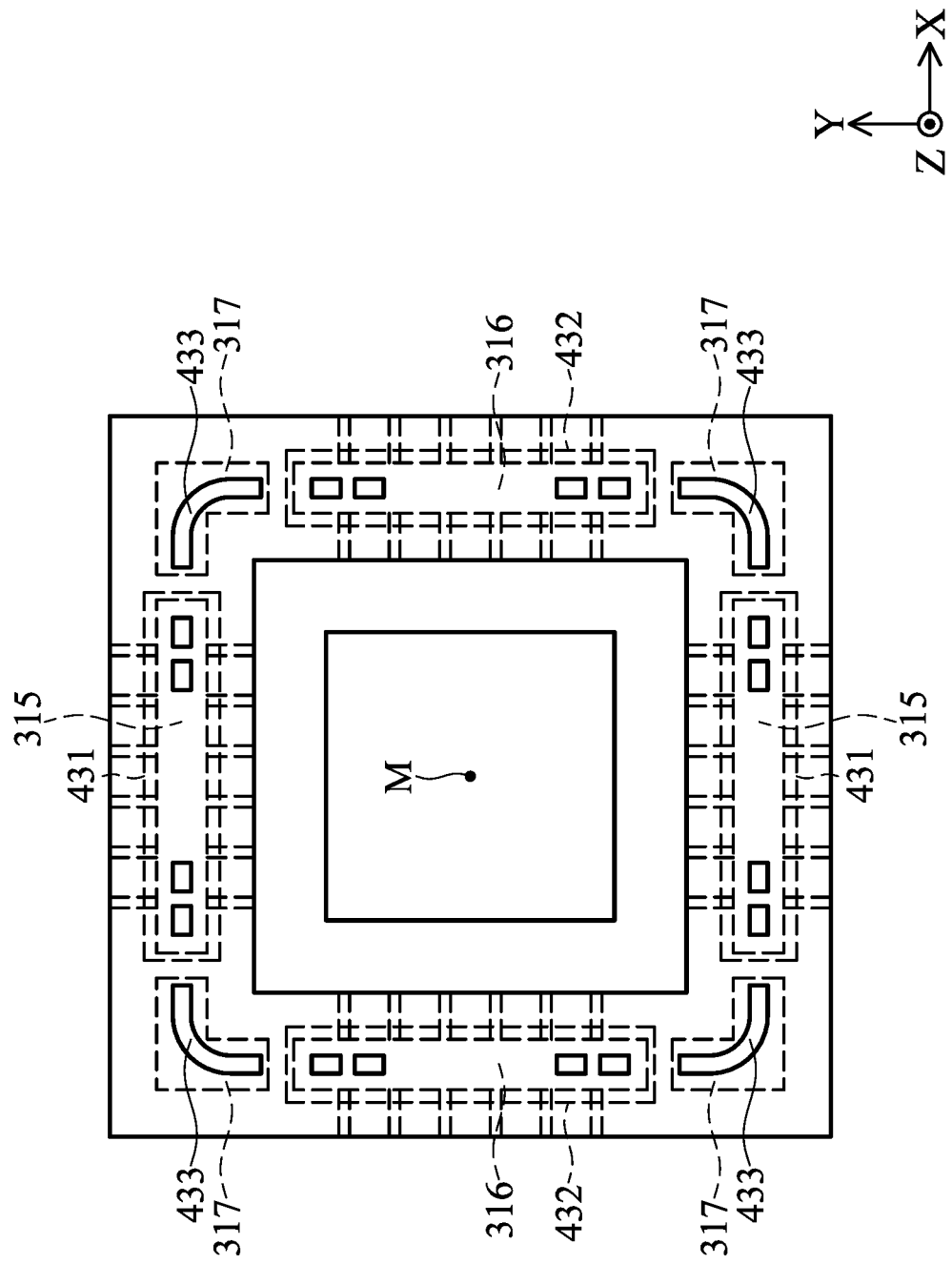
FIG. 6D is a schematic view showing the combination of the cover element and the substrate having the protruding element in some embodiments of the present disclosure.

FIG. 6D is a schematic view showing the combination of the cover element 302 and the substrate 100 having the protruding element 430 in some embodiments of the present disclosure, and some numerical references are omitted for simplicity. For example, as shown in FIG. 6D, the first protruding portions 431 and the second protruding portions 432 may be accommodated in the first recess portion 315 or the second recess portion 316, and the third protruding portions 433 may be accommodated in the third recess portions 317. In other words, the first protruding portion 431 or the second protruding portion 432 overlaps the first recess portion 315 or the second recess portion 316, and the third protruding portion 433 overlaps the third recess portion 317. Therefore, the stress caused by the adhesive element 500 may be reduced by the protruding element 430 to enhance the reliability.

Figure 6E:
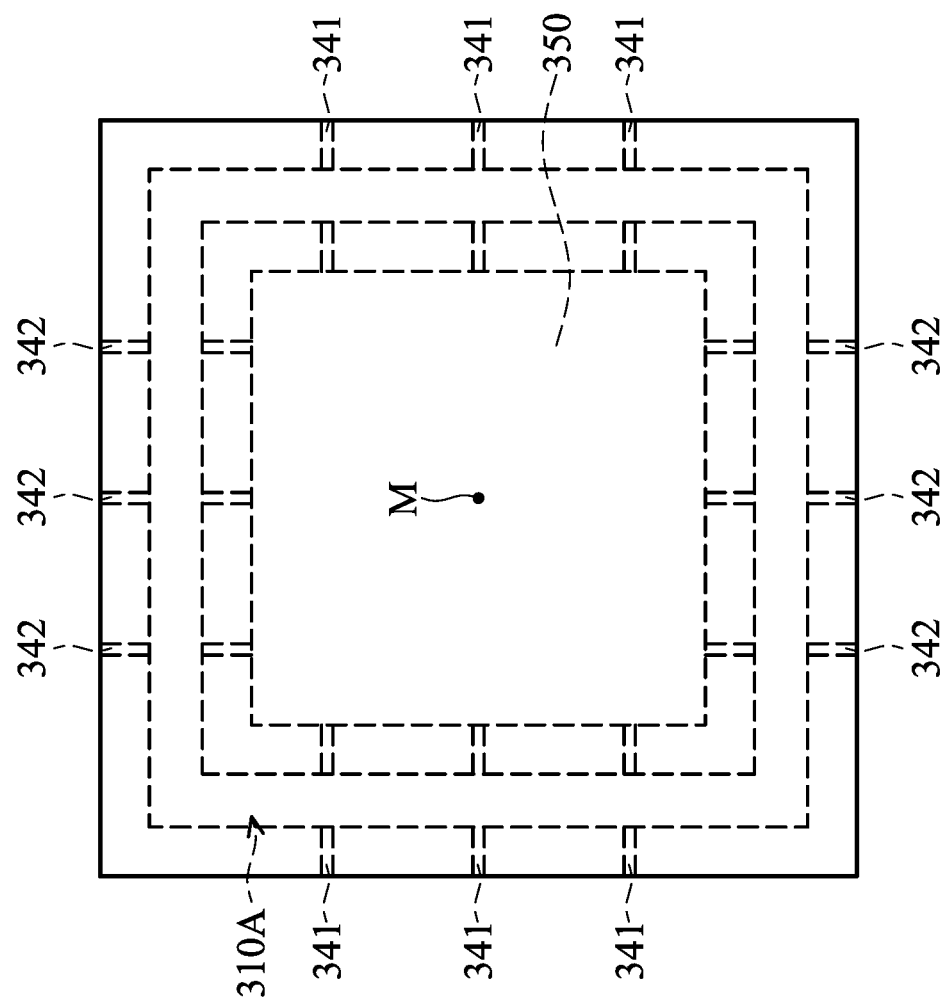
FIG. 6E, FIG. 6F, and FIG. 6G are top views of cover elements in some embodiments of the present disclosure.
Figure 6F:
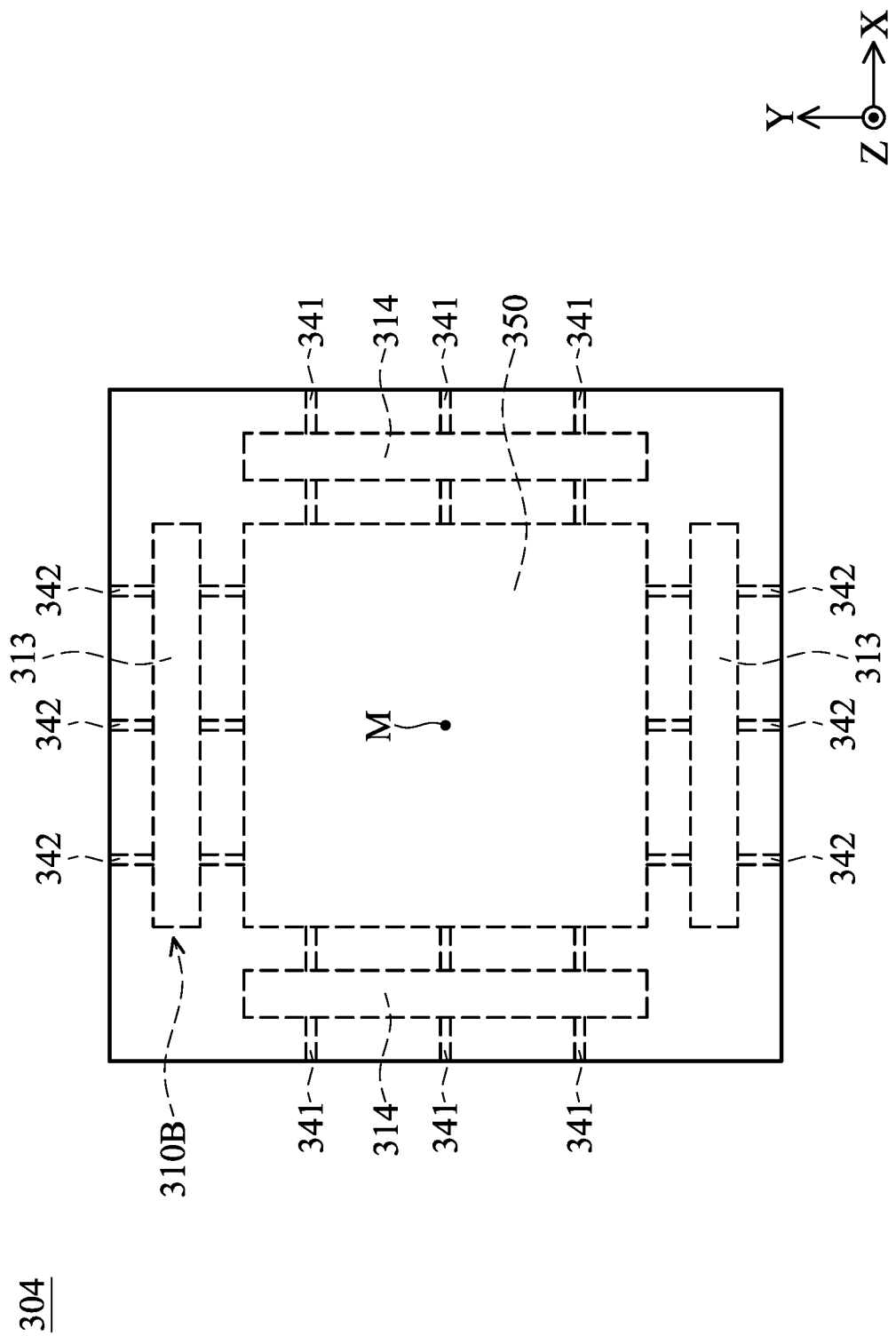
Figure 6G:
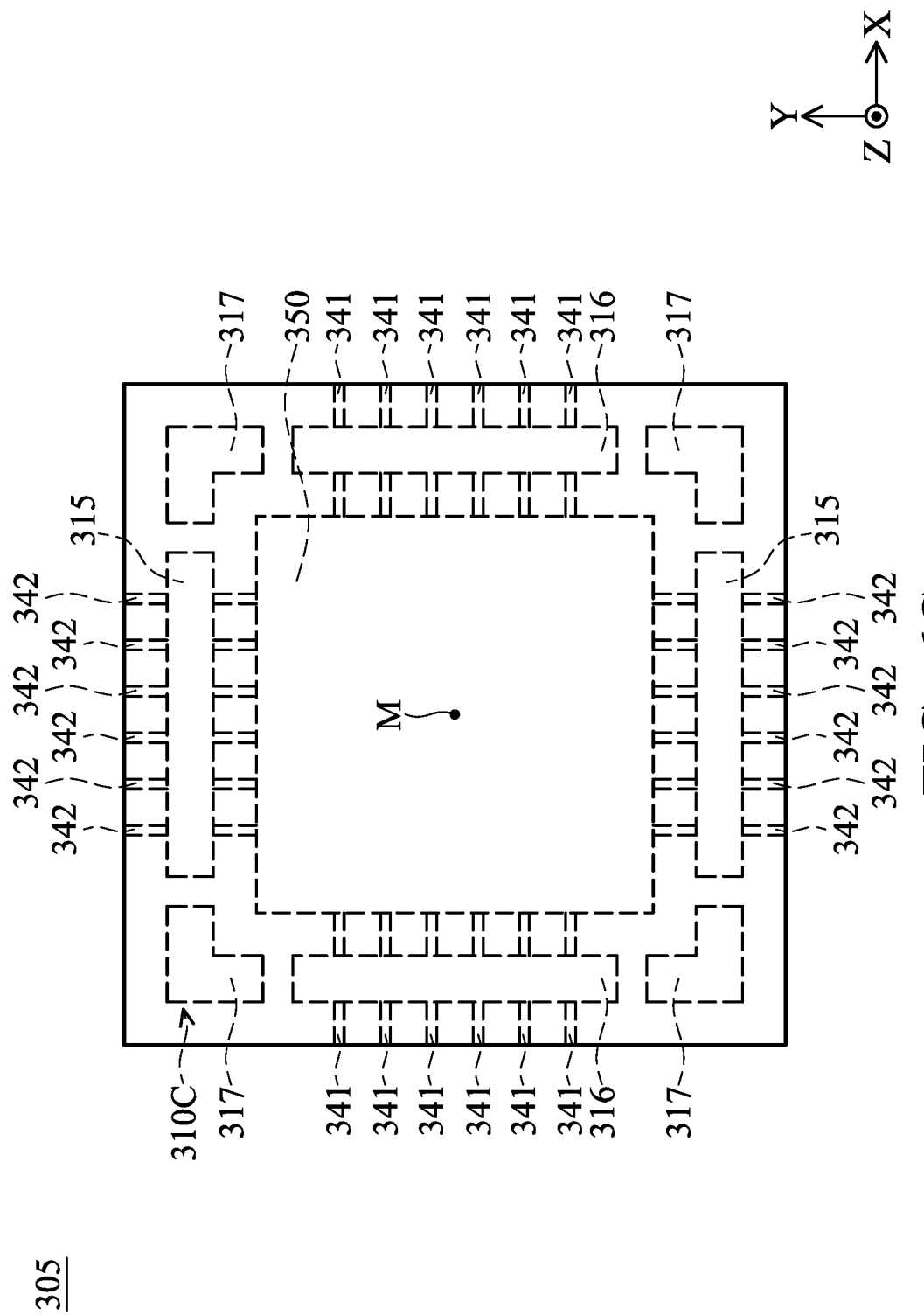

In some embodiments of the present disclosure, the cover element may be a lid structure. For example, FIG. 6E, FIG. 6F, and FIG. 6G are top views of cover elements 303, 304, and 305 in some embodiments of the present disclosure. The cover elements 303, 304, and 305 are similar as the cover elements 300A, 301 and 302 shown in FIG. 6A to FIG. 6C, and the difference is that the cover elements 303, 304, and 305 are lid structures (see FIG. 1D and FIG. 1E). Other similar features are not described again for simplicity.

In some embodiments, one of the substrate 100 with the protruding elements 400, 410, 420 or 430 and one of the cover elements 300, 300A, 300B, 300C, 300D, 300E, 300F, 301, 302, 303, 304, or 305 may be combined with each other to form the package structure, depending on design requirement.

Figure 7:
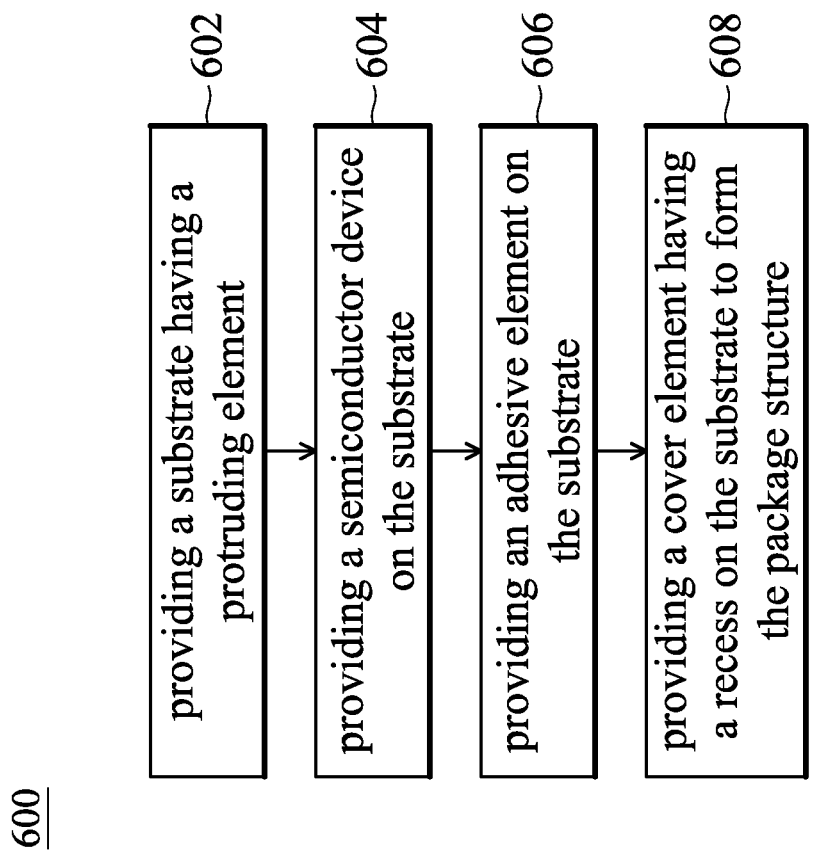
FIG. 7 is a flow chart of a method for forming the package structure in some embodiments of the present disclosure.

FIG. 7 is a flow chart of a method 600 for forming the package structure in some embodiments of the present disclosure. The method starts from an operation 602, wherein a substrate 100 is provided. The substrate 100 includes a protruding element, such as the protruding elements 400, 410, 420, or 430. The method 600 than goes to an operation 604, wherein a semiconductor device 200 is provided on the substrate 100. After the operation 604, the method 600 continues in an operation 606. An adhesive element 500 is provided on the substrate 100. Afterwards, in an operation 608, a cover element, such as the cover elements 300, 300A, 300B, 300C, 300D, 300E, 300F, 301, 302, 303, 304, or 305, is provided on the substrate 100 to form the package structure. In some embodiments, the cover element includes a ring portion surrounding a space, and a recess is formed on a surface of the ring portion that faces the substrate. In some embodiments, the semiconductor device is disposed in the space surrounded by the ring portion, and the protruding element and the adhesive element are accommodated in the recess. In some embodiments, the semiconductor device is spaced apart from the recess by the ring portion.

In summary, a package structure is provided in some embodiments of the present disclosure. The package structure includes a protruding portion on the substrate and a recess on the cover element corresponding to the protruding portion. The adhesive element may be provided to in contact with the protruding portion and accommodated in the recess. The protruding portion improves the reliability and the coefficient of performance of the package structure, and reduces the stress of the package structure. Therefore, the yield of the package structure may be improved.

A package structure is provided in some embodiments of the present disclosure. The package structure includes a substrate, a cover element, a semiconductor device, a protruding element, and an adhesive element. The cover element is disposed on the substrate and having a ring portion, a space is surrounded by the ring portion, and a recess is formed on a surface of the ring portion that faces the substrate. The semiconductor device is disposed on the substrate and disposed in the space surrounded by the ring portion, wherein the semiconductor device is spaced apart from the recess by the ring portion. The protruding element extends from the substrate and disposed in the recess. The adhesive element is disposed in the recess, wherein in a top view, the semiconductor device is surrounded by the protruding element.

A package structure is provided in some embodiments of the present disclosure. The package structure includes a substrate, a semiconductor device, a protruding element, a cover element, and an adhesive element. The semiconductor device is disposed on the substrate. The protruding element extends from the substrate. The cover element is disposed on the substrate and includes a ring portion surrounding the semiconductor device. The adhesive element is disposed between the substrate and the cover element. The ring portion has a first surface facing the substrate, and a recess is formed on the first surface. The protruding element and the adhesive element are disposed in the recess, and the adhesive element is in contact with a side surface of the protruding element. The semiconductor device is spaced apart from the recess by the ring portion.

A method of forming a package structure is provided in some embodiments of the present disclosure. The method includes providing a substrate having a protruding element, providing a semiconductor device on the substrate, providing an adhesive element on the substrate, and providing a cover element on the substrate to form the package structure. The cover element includes a ring portion surrounding a space, and a recess is formed on a surface of the ring portion that faces the substrate. The semiconductor device is disposed in the space surrounded by the ring portion, and the protruding element and the adhesive element are accommodated in the recess. The semiconductor device is spaced apart from the recess by the ring portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a substrate;
   a cover element disposed on the substrate and having a ring portion, a space is surrounded by the ring portion, and a recess is formed on a surface of the ring portion that faces the substrate;
   a semiconductor device disposed on the substrate and disposed in the space surrounded by the ring portion, wherein the semiconductor device is spaced apart from the recess by the ring portion;
   a protruding element extending from the substrate and disposed in the recess;
   an adhesive element disposed in the recess, wherein in a top view, the semiconductor device is surrounded by the protruding element; and
   an electrical connector in contact with the substrate and the semiconductor device.

2. The package structure as claimed in claim 1, wherein the protruding element comprises a first protruding portion extending in a first direction and a second protruding portion extending in a second direction, and the first direction is different from the second direction.

3. The package structure as claimed in claim 2, wherein the first protruding portion comprises a first sub-portion, a second sub-portion, and a third sub-portion, wherein a distance between the first sub-portion and the second sub-portion is different from a distance between the second sub-portion and the third sub-portion in the first direction.

4. The package structure as claimed in claim 2, wherein the protruding element further comprises a third protruding portion disposed between the first protruding portion and the second protruding portion, and the third protruding portion comprises a first end extending in the first direction and a second end extending in the second direction.

5. The package structure as claimed in claim 4, wherein in the top view, the semiconductor device is surrounded by the recess, the recess has a first recess portion extending in the first direction, a second recess portion extending in the second direction, and a third recess portion between the first recess portion and the second recess portion and separated from the first recess portion and the second recess portion, wherein the third protruding portion is disposed in the third recess portion.

6. A package structure, comprising:
   a substrate;
   a semiconductor device disposed on the substrate;
   a protruding element extending from the substrate;
   a cover element disposed on the substrate and comprising a ring portion surrounding the semiconductor device; and
   an adhesive element disposed between the substrate and the cover element, wherein the ring portion has a first surface facing the substrate, a recess is formed on the first surface, the protruding element and the adhesive element are disposed in the recess, and the adhesive element is in contact with a side surface of the protruding element, wherein the semiconductor device is spaced apart from the recess by the ring portion;
   wherein a first channel is formed on a second surface of the ring portion and connecting to the recess, and the first surface and the second surface face different directions.

7. The package structure as claimed in claim 6, wherein a top surface of the protruding element faces the cover element and is exposed from the adhesive element.

8. The package structure as claimed in claim 7, wherein in a normal direction of the substrate, a distance greater than zero is between the cover element and the top surface of the protruding element.

9. The package structure as claimed in claim 6, wherein the adhesive element comprises an inner portion and an outer portion separated by the protruding element.

10. The package structure as claimed in claim 9, wherein the inner portion of the adhesive element comprises a first inner portion and a second inner portion, the first inner portion is in contact with the side surface of the protruding element, the second inner portion is separated from the side surface of the protruding element by the first inner portion, and a height of the first inner portion is higher than a height of the second inner portion.

11. The package structure as claimed in claim 6, wherein the first channel and the adhesive element are separated by the cover element.

12. The package structure as claimed in claim 6, wherein a second channel is formed on a third surface of the ring portion, the second channel is connected to the recess, and the first surface and the third surface are parallel.

13. The package structure as claimed in claim 6, wherein the recess has an opening and a recess bottom surface, the opening is formed on the first surface, and the recess bottom surface and the first surface face in an identical direction, wherein the opening has a first width in a first direction, the recess bottom surface has a second width in the first direction, and the first width is greater than the second width.

14. The package structure as claimed in claim 6, wherein a portion of the side surface of the protruding element is exposed from the adhesive element.

15. The package structure as claimed in claim 6, wherein a top surface of the protruding element faces the cover element and comprises a first portion and a second portion, the first portion is covered by the adhesive element, and the second portion is exposed from the adhesive element.

16. The package structure as claimed in claim 6, wherein a top surface of the protruding element faces the cover element, and the entire top surface of the protruding element is covered by the adhesive element.

17. A method of forming a package structure, comprising:
   providing a substrate having a protruding element protruding from a top surface of the substrate;
   providing a semiconductor device on the substrate;
   providing an adhesive element on the substrate and in contact with the top surface of the substrate; and
   providing a cover element on the substrate to form the package structure, wherein the cover element comprises a ring portion surrounding a space, a recess is formed on a surface of the ring portion that faces the substrate, the semiconductor device is disposed in the space surrounded by the ring portion, and the protruding element and the adhesive element are accommodated in the recess, wherein the semiconductor device is spaced apart from the recess by the ring portion.

18. The method as claimed in claim 17, wherein an upper surface of the protruding element is exposed from the adhesive element, and the upper surface of the protruding element and the top surface of the substrate faces an identical direction.

19. The package structure as claimed in claim 1, wherein a top surface the protruding element facing the cover element is exposed from the adhesive element.

20. The package structure as claimed in claim 1, wherein a top surface of the protruding element is completed exposed from the adhesive element, a side surface of the protruding element is partially exposed from the adhesive element, and the top surface and the side surface face different directions.

* * * * *